(12) United States Patent
Liikanen et al.

(10) Patent No.: US 9,081,717 B2
(45) Date of Patent: **\*Jul. 14, 2015**

(54) MEMORY QUALITY MONITOR BASED COMPENSATION METHOD AND APPARATUS

(71) Applicant: Micron Technology, Inc., Boise, ID (US)

(72) Inventors: Bruce A. Liikanen, Berthoud, CO (US); Gerald L. Cadloni, Longmont, CO (US); Larry J. Koudele, Erie, CO (US); John L. Seabury, Erie, CO (US); Stephen P. VanAken, Boulder, CO (US); Guy R. Wagner, Loveland, CO (US)

(73) Assignee: Micron Technology, Inc., Boise, ID (US)

( \* ) Notice: Subject to any disclaimer, the term of this patent is extended or adjusted under 35 U.S.C. 154(b) by 0 days.

This patent is subject to a terminal disclaimer.

(21) Appl. No.: 14/479,986

(22) Filed: Sep. 8, 2014

(65) Prior Publication Data
US 2014/0380123 A1 Dec. 25, 2014

Related U.S. Application Data

(63) Continuation of application No. 13/931,519, filed on Jun. 28, 2013, now Pat. No. 8,862,969, which is a continuation of application No. 12/888,585, filed on Sep. 23, 2010, now Pat. No. 8,499,227.

(51) Int. Cl.
*H03M 13/03* (2006.01)
*G06F 11/10* (2006.01)
(Continued)

(52) U.S. Cl.
CPC ............ *G06F 11/1076* (2013.01); *G06F 11/08* (2013.01); *G06F 11/1048* (2013.01);
(Continued)

(58) Field of Classification Search
CPC ... G06F 3/0616; G06F 3/0653; G06F 3/0688; G06F 11/1048; G06F 11/008; H04W 24/00; H04W 28/04; H04W 28/18
USPC .................. 714/42, 786, 794, E11.179, 47.2, 714/E11.004, 30, 755, 782, 784; 711/E12.008, 103
See application file for complete search history.

(56) References Cited

U.S. PATENT DOCUMENTS 6,034,996 A 3/2000 Herzberg
6,160,854 A 12/2000 Heegard et al.
(Continued)

OTHER PUBLICATIONS

Ungerboeck, Channel Coding with Multilevel/Phase Signals, Jan. 1982, Ieee Transactions on Information Theory, vol. IT-28, No. 1, pp. 55-67.
(Continued)

*Primary Examiner* — Guy Lamarre
(74) *Attorney, Agent, or Firm* — Pritzkau Patent Group, LLC

(57) ABSTRACT

In one embodiment, an encoder reads a set of data from memory cells to obtain retrieved data influenced by one or more distortion mechanisms as a result of having been stored. A quality metric is generated responsive to the retrieved data that changes in value responsive to differences between the user data and the associated retrieved data. A quality monitor establishes a relationship between a current value of the quality metric and a threshold value and monitors the relationship as being indicative of a degradation of the quality of the retrieved data, and selectively initiates an error response. In another embodiment, a correction value is iterated through a set of values as a quality metric is monitored such that the value of the quality metric which most closely approaches the value of the quality metric immediately subsequent to an initial writing of the data can be selected.

20 Claims, 13 Drawing Sheets

(51) Int. Cl.
*H03M 13/11* (2006.01)
*H03M 13/15* (2006.01)
*H03M 13/37* (2006.01)
*H03M 13/41* (2006.01)
*G06F 11/08* (2006.01)
*G11C 11/56* (2006.01)

(52) U.S. Cl.
CPC ........ *H03M13/1111* (2013.01); *H03M 13/152* (2013.01); *H03M 13/1515* (2013.01); *H03M 13/3738* (2013.01); *H03M 13/41* (2013.01); *H03M 13/4138* (2013.01); *G11C 11/5621* (2013.01); *G11C 11/5671* (2013.01)

(56) References Cited

U.S. PATENT DOCUMENTS

| | | | |
|---|---|---|---|
| 7,142,612 B2 | 11/2006 | Horowitz et al. | |
| 7,379,505 B2 | 5/2008 | Zaleski, II et al. | |
| 8,499,227 B2 * | 7/2013 | Liikanen et al. | 714/42 |
| 8,862,969 B2 * | 10/2014 | Liikanen et al. | 714/786 |
| 2003/0235149 A1 | 12/2003 | Chan et al. | |
| 2004/0001561 A1 | 1/2004 | Dent et al. | |
| 2004/0014444 A1 | 1/2004 | Ben Rached et al. | |
| 2008/0086677 A1 | 4/2008 | Yang et al. | |
| 2008/0162791 A1 | 7/2008 | Eldredge et al. | |
| 2008/0198650 A1 | 8/2008 | Shalvi et al. | |
| 2009/0013233 A1 | 1/2009 | Radke | |
| 2009/0067237 A1 | 3/2009 | Lee et al. | |
| 2009/0204852 A1 | 8/2009 | Diggs et al. | |
| 2009/0241006 A1 | 9/2009 | Liikanen et al. | |
| 2009/0319825 A1 | 12/2009 | Yang et al. | |

OTHER PUBLICATIONS

Wicker, Stephen B., *Error Control Systems for Digital Communication and Storage*, 1995, Prentice-Hall pp. 238-239 and 290-332.

The International Search Report and the Written Opinion of the International Searching Authority for International Application No. PCT/US2011/050801 which is associated with U.S. Appl. No. 12/888,585, Apr. 10, 2012, Republic of Korea.

* cited by examiner

MEMORY QUALITY MONITOR BASED COMPENSATION METHOD AND APPARATUS

RELATED APPLICATIONS

This application is a continuation application of U.S. patent application Ser. No. 13/931,519 filed Jun. 28, 2013 which matured into U.S. Pat. No. 8,862,969, issued on Oct. 14, 2014; which is a continuation application of U.S. patent application Ser. No. 12/888,585 filed Sep. 23, 2010, which matured into U.S. Pat. No. 8,499,227, issued on Jul. 30, 2013, the disclosures of which is incorporated herein by reference.

BACKGROUND OF THE INVENTION

The present invention is related generally to the field of nonvolatile memory that is made up of an array of memory cells and, more particularly, to a method and apparatus at least for initiating error compensation for such memory responsive to a quality monitor.

A recent trend relating to flash memory resides in attempting to increase storage capacity by increasing the amount of information that is stored by individual memory cells which collectively make up an array of memory cells. As recognized, for example, by U.S. Published Patent Application no. 2008/0162791 (hereinafter, the '791 Application), which is incorporated herein by reference, increasing the number of data levels per memory cell causes a proportionally increasing probability of error when data is read back from the memory. This increase in error probability is attributable, at least in part, to increasing the number of data levels stored by each memory cell since an associated increase in accuracy would be needed to resolve between the data levels. Hence, it is more likely that distortion mechanisms, which affect the values stored by the individual memory cells, can contribute a shift in a data value stored by a given memory cell that can result in improperly shifting a read data value across a threshold between the relatively more closely positioned data thresholds. The '791 Application teaches the use of error correction codes to compensate for the increase in error probability. While the '791 Application represents a remarkable improvement over the then-existing state-of-the-art, Applicants, believe that additional techniques can be employed which provide sweeping improvements over the '791 Application.

In addition to the exemplary aspects and embodiments described above, further aspects and embodiments will become apparent by reference to the drawings and by study of the following descriptions.

BRIEF DESCRIPTION OF THE DRAWINGS

Example embodiments are illustrated in referenced figures of the drawings. It is intended that the embodiments and figures disclosed herein are to be illustrative rather than limiting.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles taught herein may be applied to other embodiments. Thus, the present invention is not intended to be limited to the embodiment shown, but is to be accorded the widest scope consistent with the principles and features described herein including modifications and equivalents, as defined within the scope of the appended claims. It is noted that the drawings may be diagrammatic in nature in a way that is thought to best illustrate features of interest. Descriptive terminology may be adopted for purposes of enhancing the reader's understanding, with respect to the various views provided in the figures, and is in no way intended as being limiting.

While at least some of the examples provided herein are framed in terms of arrays of nonvolatile memory cells that store charge such as NAND and NROM Flash memory, it should be appreciated that use of electrical charge as a variable physical parameter in such memory cells is not intended as being limiting and that any suitable variable physical parameter may be employed. For example, the physical parameter, in addition to electron or hole storage, includes resistance in a phase change medium storage device (Phase Change Memory (PRAM, nanotubes)), magnetic moment or magnetic spin direction in a magnetic storage device (Probe Storage), capacitance change (FerroElectric Random Access Memory (FERAM)), or molecular storage), MRAM (Magnetic Random Access Memory) and MEMS (Micro Electro-Mechanical) based media or any combination of the above. Other suitable memory forms may yet be developed.

Figure 1:
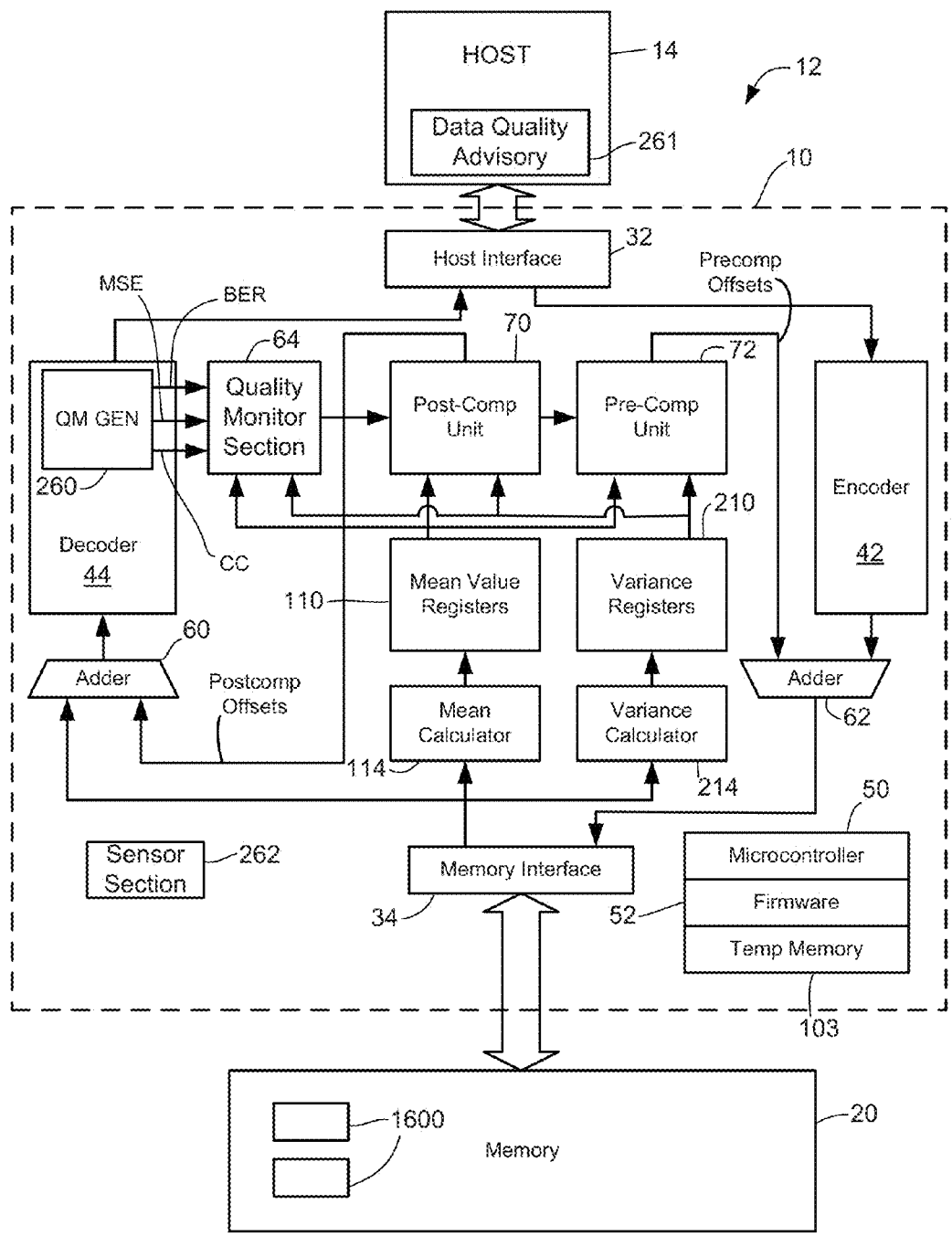
FIG. 1 is a block diagram which illustrates one embodiment of a memory controller, produced according to the present disclosure, forming part of an overall system, for providing quality metric based compensation.

With attention now directed to the drawings wherein like elements may be indicated using like reference numbers throughout the various figures, FIG. 1 is a block diagram which includes a memory controller, indicated by the reference numeral 10 within a dashed line, forming part of an overall system which is generally indicated by the reference number 12. System 12 further includes a host 14 and a solid state nonvolatile memory 20 which are interfaced with one another by memory controller 10. Host 14 is connected to a host interface 32, forming part of the memory controller, while memory 20 is connected to a memory interface 34 which forms another part of memory controller 10. The host may be any suitable form of device such as, for example, a personal computer. The memory interface may include one or a plurality of memory ports which make up the physical connection between the memory interface and any attached memory devices. In addition, there may be one or a plurality of memory interfaces. A plurality of memory interfaces, each with a plurality of memory ports can be provided in a controller for purposes of high memory system throughput by enabling more than one memory device to concurrently execute read or write operations using a single attached controller.

In system 12, host 14 stores and retrieves data using the storage cells that make up nonvolatile memory 20. Reading and writing is enabled by an encoding section 42 and a decoding section 44, respectively, that convey data from the host to the nonvolatile memory and from the memory to the host. Storage of data by the host into the memory can be executed in such a way that bit errors, occurring when the host reads the data, can be identified and removed from the data by the decoding process before being returned to the host. A microcontroller 50 and firmware 52 can provide control signals and management as necessary for the various components of memory controller 10, although control lines have not been shown for purposes of illustrative clarity. During read and write operations, the microcontroller can receive and interpret commands from host 14 and carry out such operations, among other operations. Any of the techniques described herein may be implemented using software, firmware, hardware or any suitable combination thereof. In this way, memory controller 10 operates to receive commands from the host and, in response to these commands, write data that the memory controller receives from the host to one or more memory devices attached to memory interface 34, or the memory controller reads data from one or more attached memory devices and returns the read data to the host. Other functions can be implemented and executed via commands issued over host interface 32. These additional functions can include data transfer between the host computer and the controller. In some embodiments, compensation can be applied to data flows on the memory controller side of the memory interface.

Still referring to FIG. 1, nonvolatile memory 20 can be made up of one or more individual memory devices each of which may be accessed by encoding section 42, which may be referred to interchangeably as an encoder, or decoding section 44, which may be referred to interchangeably as a decoder. The device technology for the nonvolatile memory may be any nonvolatile medium capable of storing more than one bit per memory cell. The device or devices which make up memory 20 can be provided in the form of one or more non-volatile memory devices which may conform to any suitable technology that is capable of non-volatile retention of data based on a variable physical parameter that characterizes a data value that can be saved by each individual memory cell. Each memory device can be a semiconductor die. Present day data storage systems that may benefit from the advanced technology described herein can use NAND Flash as the storage medium, but this advanced technology is equally applicable with respect to devices based on any other suitable form of nonvolatile memory either currently available or yet to be developed, as described above. Such other suitable forms of nonvolatile memory can realize benefits similar to those seen with NAND Flash.

Host 14 can be any suitable device that issues read and write commands to the data storage and retrieval system. The host normally includes a processor, and can be part of a computer system, but may also be part of an embedded system. Encoder 42 operates during the process of data transfer from host 14 to memory 20. The encoder can perform a transformation on data submitted by the host in such a way that at least some errors may be detected and corrected when the host subsequently requests that it be read from memory 20. Decoder 44 operates during the process of data transfer from memory 20 to host 14. The decoder can perform a transformation on data that is retrieved from the memory in the form that the data is stored by the memory and convert the data to the form in which it was originally submitted to the encoder by the host. The form of the data as stored in memory 20 can include an encoding which enables decoder 44 to detect and correct bit errors in the data that occur, for example, because of memory 14 imperfections and/or distortions such as is described, for example, in U.S. patent application Ser. No. 12/403,546, entitled BITWISE OPERATIONS AND APPARATUS IN A MULTI-LEVEL SYSTEM, filed on Mar. 13, 2009 and U.S. patent application Ser. No. 12/794,706, entitled ADVANCED BITWISE OPERATIONS AND APPARATUS IN A MULTI-LEVEL SYSTEM WITH NONVOLATILE MEMORY, filed on Jun. 4, 2010, both of which applications are commonly owned with the present application and both of which are incorporated herein by reference.

Embodiments that are produced according to the present disclosure can apply to the implementation of the encoder, decoder, and nonvolatile memory, as well as applying to a system environment in which the host directs operation by sending commands that result in a transfer of data for storage into the memory and that result in a transfer of data to the host after recovery from storage in the memory.

Application of post-compensation correction can be applied to an incoming read data stream, for example, by a post-compensation adder 60 or similar mechanism that receives a correction value associated with each read value received from the memory interface, as will be further described. The compensation value itself may constitute a combination of results which can arise based on quality metric monitoring and determination techniques that are described below. In one embodiment, microcontroller 50 under firmware control can determine the compensation values and place the resultant values into a suitable memory. Application of the now-memory-resident compensation values can, in one embodiment, be applied by a dedicated hardware sequencing mechanism that retrieves the compensation values from the memory and applies the values, via post-compensation adder 60, to the incoming read stream.

Application of pre-compensation correction can proceed analogously to the pre-compensation process described immediately above, however, the correction value is applied by a pre-compensation adder 62. The main difference resides in applying the pre-compensation correction values to a write data stream rather than a read data stream. Again, the compensation value itself may be made up of a combination of results based on quality metric monitoring and determination techniques yet to be described.

A quality metric can be based upon some form of information that is collected which can reflect, for example, distortions that are present in memory 20 such that suitable compensation can be applied responsive to the distortion. Regardless of the underlying distortion mechanism which is subject to compensation, the present disclosure can act to reverse the effect of the distortion on any data value by reversing the difference exerted by the distortion on the data. Since the present disclosure applies to data storage and retrieval, and controllers for this purpose implement processes that alternatively write and read stored information, compensation may be applied to either of these processes (read or write). An information acquisition step can form part of the determination of a quality metric and, therefore, may precede, with equal validity, compensation during the read process (post-compensation) or compensation during the write process (pre-compensation) with little or no difference in the mechanism in going from one to the other.

In forming the basis of a quality metric, embodiments can perform information acquisition of at least the following types:
1) statistical average (mean calculation),
2) statistical variation (variance calculation), and
3) statistical error rate gathering.

Determinations in (1), (2) and (3) can be performed on data units either stored in memory 20 or targeted for write to the memory. Because the distortions of interest can derive from physical aspects of each memory device, the data units for calculation purposes are necessarily sized according to the physical page size of each memory device. A data unit can be a portion of a physical page, one entire physical page or multiple physical pages: the dependency of a data unit on these physical attributes can be based on read characteristics of the particular memory. It is important to note the distinction between a data unit, as described above, and a codeword, which corresponds with logical extents of data. Codewords may be constructed from one or more data units. In this way, the data units differ from codewords, because quality calculations are generally concerned with data units whereas the encoding and decoding circuitry of the controller is concerned with codewords. The distinction between codewords and data units for calculation is a function of the fact that codeword extent is related to the encoding and decoding process (rather than quality metric calculation). Because of the physical aspect of data units to which quality metrics apply, codewords can be, in suitable embodiments, a subset of a data unit, a superset of a data unit, or the same as a data unit.

If a codeword spans more than a single data unit then, in this case, the quality metrics can be calculated individually for as many data units as constitute the codeword. Nevertheless, the data units for purposes of calculations (1), (2), and (3) may at times comprise the same streams serving the controller's encode and decode (write and read) processes. Further, in one embodiment, the determinations can be based on the current data being read (or written) by a read (or write) process in the controller on behalf of the host connected to the controller. In another embodiment, the determinations may proceed independently of any host command, using one or more preexisting data units solely for the purpose of performing the determinations of interest. Such preexisting data units, for example, can already be resident in memory 20 from a prior write operation.

The components of FIG. 1 provide for performing compensation determinations based on a quality metric including any one or more of a statistical average, a statistical variation and a statistical error rate in any suitable or desired combination. It should be appreciated that any suitable statistic may be employed as a quality metric and that the examples set forth herein are not intended as being limiting. A quality monitoring section 64 can monitor any quality metrics that are of interest and available such as, for example, a statistical average, a statistical variation and a value based on statistical error rate gathering, as will be described in detail below. Quality monitoring section 64, in one aspect, serves to track the quality of data based on one or more quality metrics and establishes the amount of compensation to be applied based on the quality metric(s). In some embodiments, QM section 64 can make determinations based on thresholds to determine the quality of the data being measured. In this sense, the term quality relates to the data being free of errors. That is, the fewer errors present in the data, the higher the quality of the data. In some embodiments, quality monitoring section 64 can be made up of any suitable combination of hardware and software. A post-compensation unit 70 and a pre-compensation unit 72, respectively, are configured for determination of compensation values whether in a post-compensation context or a-pre-compensation context. A specific amount or magnitude of the compensation can be influenced by quality monitoring section 64. That is, if one or more quality metrics that are being monitored indicate a relatively large amount of data degradation, an overall amount of compensation can be proportionally increased. Each one of a selected set of post-compensation determinations can be established by post-compensation unit 70 and combined prior to being provided as an output to post-compensation adder 60. For example, an overall compensation value can be made up of a combination of contributions from each one of a statistical average, a statistical variance and one or more statistical error rate values, any sub-combination of these items or any one of these items in a flexible manner. This overall-post-compensation output can be added to a current read value that is received from memory interface 34 prior to the current value entering decoder 44. Similarly, each one of a selected set of pre-compensation determinations can be established by pre-compensation unit 72 and combined prior to being provided as an output to pre-compensation adder 62. This pre-compensation output can be added to a current write value that is received from encoder 42. The selected set of pre-compensation determinations can be different from the selected set of post-compensation determinations and either set can include any desired combination of the available determinations, a subset of the available determinations or a single selected one of the determinations.

Figure 2:
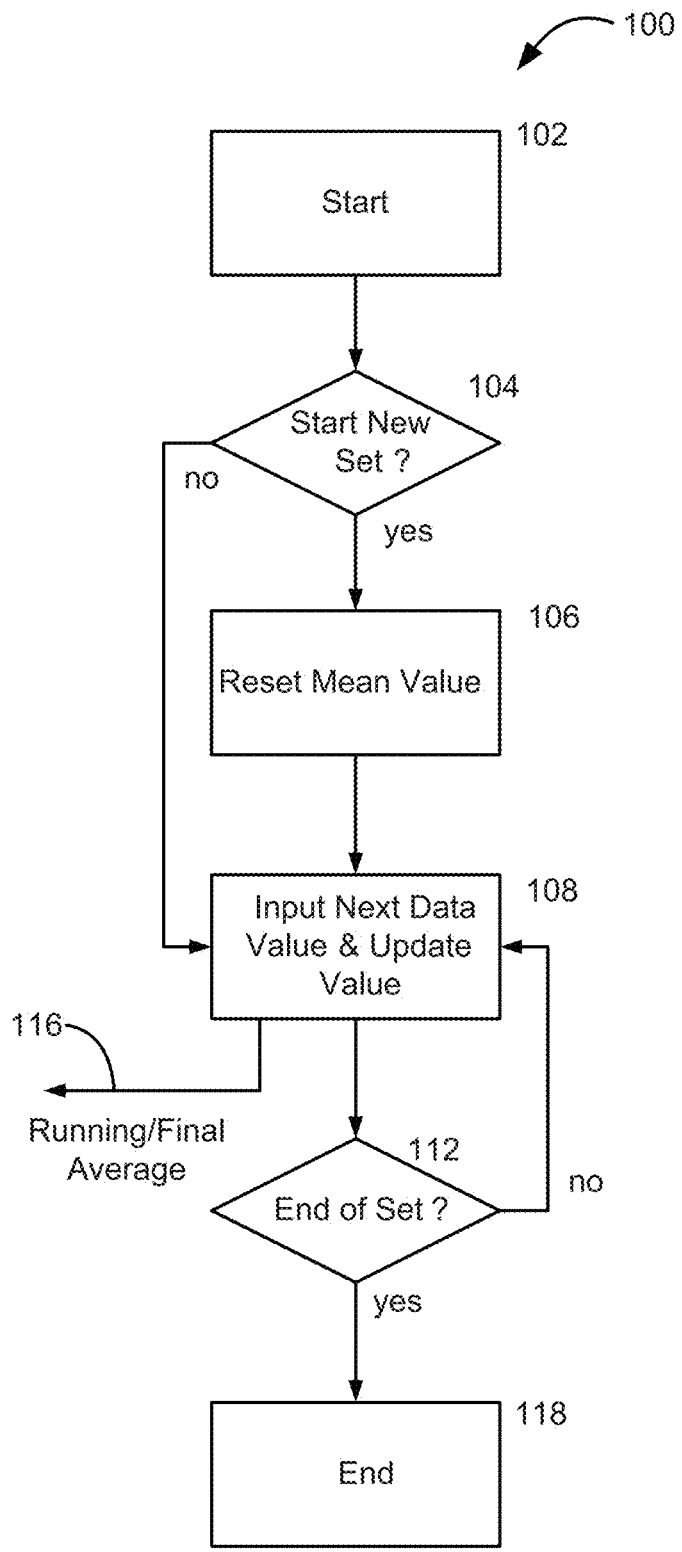
FIG. 2 is a flow diagram which illustrates one embodiment of a technique for determining a mean value of a set or distribution of values.

Turning now to FIG. 2 in conjunction with FIG. 1, the former illustrates one embodiment of a method, generally indicated by the reference number 100, for determining a statistical mean value. Method 100 can accomplish establishing an average value for any series of data values presented to the method. The process of statistical mean value determination is usually one in which the average value (mean) of all the individual data values of a set are determined. Though not a requirement, the approach can involve the processing of data values either targeted to a single physical page in a memory device, read from a single physical page in the memory device, an erase block or any suitably sized unit of the memory. Method 100 begins with step 102 in which firmware 52 can arrange to process a targeted set of data values by queuing the set for entry into the process. The queue of values can be formed, for example, in a temporary memory 103 accessible by microcontroller 50, already present in a buffer of controller 10 or in any suitable location that is accessible to the controller such that the process can sequence through the data. Suitable buffers can be provided, for example, as part of post-compensation unit 70 and pre-compensation unit 72 in addition to temporary memory 103. At 104, it is determined whether the process is oriented at the beginning of the targeted set of values. If the process is oriented at the beginning of the targeted set of data values, the process can initialize itself at 106 by clearing any residual value that may remain from previous sets of data values. At 108, the initial data value is obtained and stored as the current mean value. A mean value register section 110 (FIG. 1) can be provided for purposes of storing one or more mean value determinations. Step 112 then determines if another value is available in the set. If so, operation returns to 108 which re-determines a new current mean value by adding the new value to a cumulative total of values and dividing by a total number of values in a known manner to arrive at a new current mean value. The mean value calculation can be performed by a mean value calculator 114 (FIG. 1). At 116, a running or final average output is available to the controller. Steps 108 and 112 continue to operate in a loop until step 112 determines that the end of the set of values has been reached. At that time, the process terminates at 118 with the final mean value of the set being available at 116. Accordingly, the process iterates over each of the data values in the set, taking in one value per iteration and updating the output value on each iteration. At the end of the process, the result for the current set of data values is available to the controller.

By the process shown in FIG. 2, an embodiment can include hardware for mean value calculation as the result of the data values from the set being streamed through the calculation hardware. Firmware 52 can be responsible for configuring and initializing transfer of the data values into the hardware, once the transfer is started, the hardware can automatically update the mean value based on each additional data value. Such hardware-based mean value calculation and will be familiar to those having ordinary skill in the art.

Figure 3:
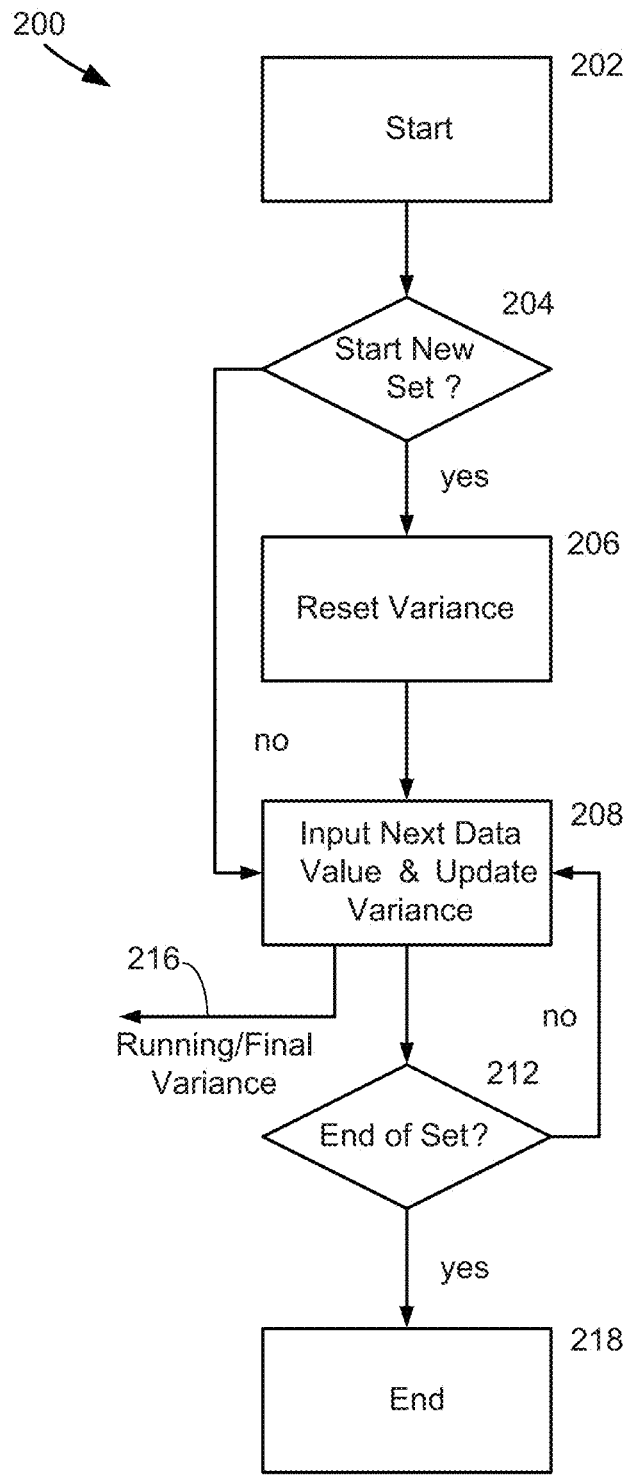
FIG. 3 is a flow diagram which illustrates one embodiment of a technique for determining a variance value of a set or distribution of values.

Referring to FIG. 3 in conjunction with FIG. 1, the former illustrates one embodiment of a method, generally indicated by the reference number 200, for determining a statistical variance value. Method 200 can accomplish establishing a variance value for any series of data values presented to the method. It should be appreciated that the process of variance calculation is usually one in which the variance (which may be referred to in terms of the standard deviation or sigma) of all the individual data values of a set are determined. Though not a requirement, the approach can involve the processing of data values either targeted to a single physical page in a memory device, or read from a single physical page in the memory device, an erase block or any suitably sized unit of the memory. The variance calculation itself can generally be performed more quickly and efficiently as a hardware function than as a software function and can be implemented by any hardware-based technique that performs a summation of the squared differences between individual data values and the average data value, although hardware implementation is not a requirement. Those of ordinary skill in the art will be familiar with both software and hardware implementations for purposes of variance determination. Method 200 begins at start 202 in which firmware 52 (FIG. 1) can arrange to process a targeted set of data values by queuing the set at the entry to the process. The queue of values can be formed, for example, in temporary memory 103 that is associated with microcontroller 50, already present in a buffer of controller 10, as described above, or in any suitable location that is accessible to the controller such that the process can sequence through the data. At 204, it is determined whether the process is oriented at the beginning of the targeted set of data values. If the process is oriented at the beginning of the targeted set of data values, the process can initialize itself at 206 by clearing any residual variance value that may remain from prior sets of data values. At 208, the initial data value is obtained and stored. A variance value register section 210 (FIG. 1) can be provided for purposes of storing one or more variance value determinations. Step 212 then determines if another value is available in the set, for example, by retrieving an additional data value and recomputing the variance based on the set of all previous data values plus the additional data value. If so, operation returns to 208 which re-determines a new current variance value by retrieving an additional data value and redetermining the variance based on the set of all previous data values plus the additional data value. The variance value calculation can be performed by a variance value calculator 214 (FIG. 1). At 216, a running or final variance output is available to the controller. Steps 208 and 212 continue to operate in a loop until step 212 determines that the end of the set of values has been reached. At that time, the process terminates at 218 with the final variance value of the set being available at 216. Accordingly, the process iterates over each of the data values in the set, taking in one value per iteration and updating the output variance value on each iteration. At the end of the process, the variance result for the current set of data values is available to the controller.

By the process shown in FIG. 3, an embodiment can include hardware for variance value calculation as the result of the data values from the set being streamed through the calculation hardware. Firmware 52 can be responsible for configuring and initializing transfer of the data values into the hardware, once the transfer is started, the hardware can automatically update the variance value based on each additional data value. Such hardware-based variance calculation will be familiar to those having ordinary skill in the art.

Referring to FIG. 1, a quality metric generator 260 may form part of decoder 44 for performing statistical error rate determinations to establish one or more quality metrics. In one embodiment, the decoder may include a Viterbi detector such that the quality metric is the delta of branch metrics of the Viterbi detector for each memory device that forms part of memory 20. Signal processing algorithms such as Viterbi decoders commonly are designed with an accumulation of their branch metrics, referred to as the Mean Square Error, or MSE, between the expected values of a sequence and the actual values received. The MSE is a metric of data quality captured in real time as the data is decoded. Applicants recognize that this information relating to data quality can be used in a number of different ways to improve a system, as will be further described.

In yet another embodiment, decoder 44 includes a Reed Solomon decoder which counts the number of symbol corrections that are performed for each block of Reed Solomon data that is decoded, as quality metric generator 260. The count of symbol corrections of the Reed Solomon decoder can be used as a measure of data quality for each memory device in the system. It will be appreciated that a Reed Solomon (RS) detector is capable of correcting up to a certain number of RS symbols per RS block. In some embodiments, the number of symbol corrections per RS block can be monitored. For example, the decoder can identify each RS block for which only one symbol is corrected; identify each RS block for which two symbols are corrected; and identify each RS block for which three RS symbols are corrected, and so on. In this way, a histogram can be built based on the number of symbol corrections per RS block. Typically, one symbol of correction will occur much more often than progressively greater numbers of symbol corrections. This form of correction data can be used as the quality metric to determine the overall quality of the data and the system error rate. It should be appreciated that any suitable statistical error rate that can be tracked by quality metric generator 260 can form the basis of a quality metric and that the specific forms of quality metrics that are described in detail herein are not intended as being limiting.

Applicants recognize that a quality monitor in a nonvolatile memory system can be used to calibrate different devices for known characteristics, correct in-system data quality with correction values, detect data aging affects, report data quality to the host system for further action and, in the case of high quality data, increase the throughput performance or data density. The quality monitor allows an intelligent non-volatile (NVM) controller to modify the memory system based on the quality monitor information. System modifications can include actions, by way of example, that will improve the reliability of data for longer periods of time or give the ability to report imminent failure to the host system so that data can be moved to a new location before that data is lost.

Still referring to FIG. 1, quality monitoring section 64 of controller 10 can monitor one or more quality metrics based on normal user data as this data travels through the system. That is, there is no requirement to utilize special calibration data for purposes of the establishing a quality metric. Accordingly, quality metrics can be generated and monitored with limited or essentially no impact on system throughput. That is, quality metric data can be accumulated based on conventional user-data access. In other words, the quality data can be accumulated without making additional "out-of-band" accesses to special dedicated calibration data and other such resources. In some embodiments, with low- or no-impact to system throughput, all required calculations can be performed by the controller in a streaming data fashion. Accordingly, through the use of normal data, potential degradation of data can be monitored. Based on the level of degradation, a response event can be initiated, for example, by microcontroller 50, host 14 or at the discretion of the user of the system. The response event can include one or more of notifying the user of an unacceptable level of data degradation and an automated activation of a compensation technique in a post-compensation or pre-compensation context. Such an indication is indicated at 261 in the form of a notification that is issued by host 14, for example, on a display that is associated with the host. The initiation of the response event can be: (1) initiated by the user, (2) triggered by a data quality metric in comparison to some threshold wherein the quality metric can be the standard deviation or variance of the data distributions determined by variance calculator 214, a mean value shift of a distribution of normal data or calibration data determined by mean value calculator 114, a Mean Squared Error or path metric of a Viterbi detector forming part of decoder 44 and serving as QM generator 260 and the number of corrected symbols of a BCH or Reed Solomon detector or decoder forming part of decoder 44 and similarly serving as QM generator 260. In some embodiments, a sensor section 262 can include a temperature sensor which is provided such that an absolute temperature and/or change in temperature can cause quality monitor section 64 to initiate a response event including, but not limited to comparing a current quality metric value to a threshold value and, subject thereto, triggering a further response in terms of initiating compensation. Similarly, sensor section 262 can include a voltage monitor which monitors a supply voltage such that a sufficiently large change in the supply voltage causes quality monitor section 64 to initiate a response event. In one embodiment, quality monitor section 64 can initiate a response event responsive to the passage of some predetermined period of time, for example, since the last time the quality metrics were checked. In this regard, any measurable parameter can be utilized for purposes of causing controller 10 to engage in checking any quality metrics that are of interest and, thereafter, taking appropriate responses based on changes in the quality metrics that are indicative of data degradation.

Figure 4:
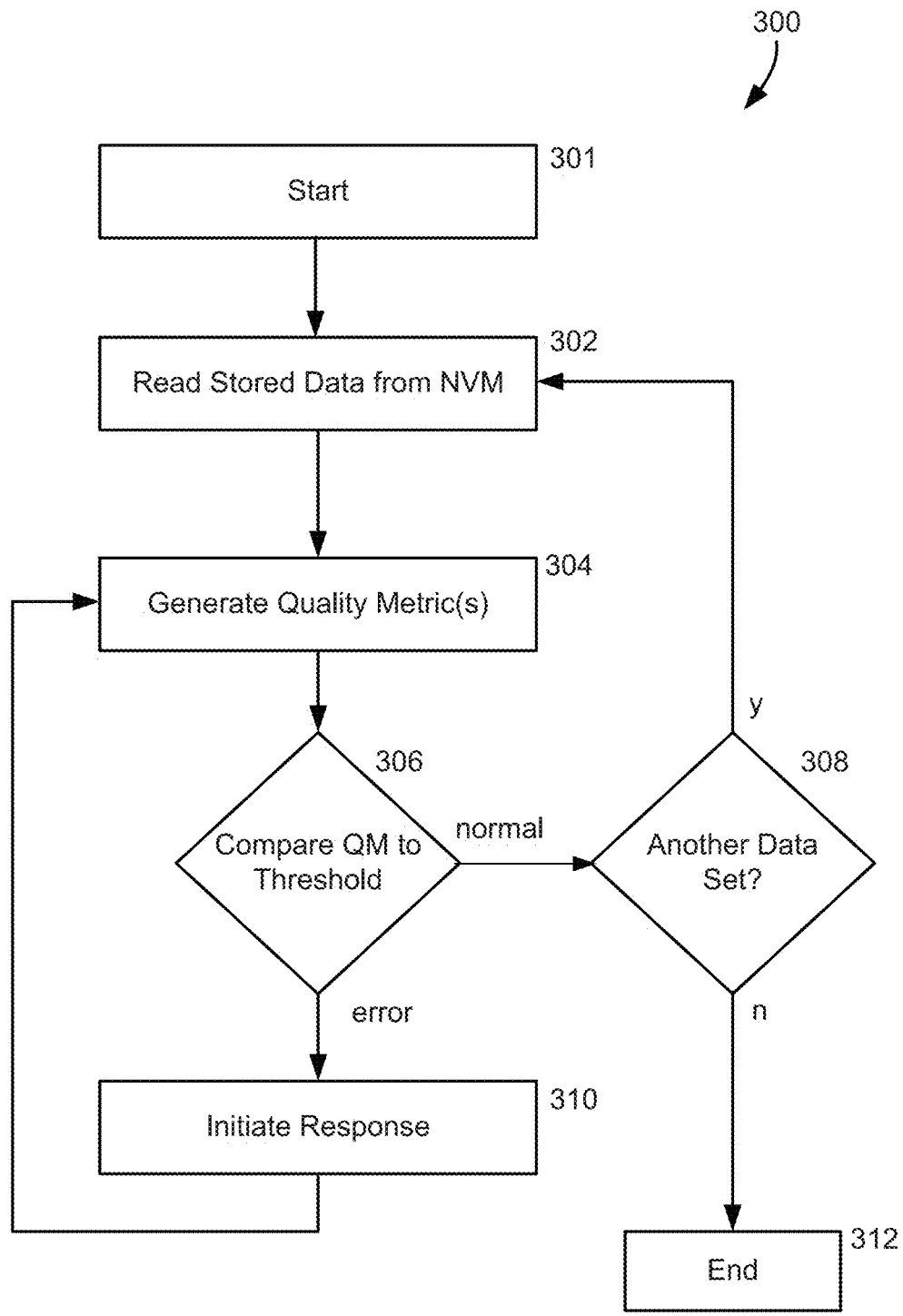
FIG. 4 is a flow diagram which illustrates one embodiment of a method for the operation of the controller of FIG. 1 relating to one or more quality metrics.

Turning now to FIG. 4, one embodiment of a method for operation of controller 10 of FIG. 1 is generally indicated by the reference number 300. The method begins at start 301. At 302, a set of data is read from memory 20. This data can be normal user data in some implementations and, in other implementations, calibration data previously saved and having one or more known characteristics such as, for example, a known mean value and a known variance or standard deviation. When normal user data is used, the mean value and/or variance can be determined prior to writing the data to memory 20 and the determined values can be stored in mean value registers 110 and variance registers 210 for future reference. Further, a statistical error rate can be determined essentially immediately after writing the data to memory 20, for example, by reading the data and monitoring the output of QM generator 260 which can produce a branch metric of a Viterbi decoder or an LDPC decoder, as discussed above, and dependent upon the particular error correction codes that are in use. Also as described above, a block correction code such as, for example, Reed Solomon or BCH may be in use such that the number of symbols corrected per codeword can serve as a quality metric. Accordingly, for the set of stored data that is read, an associated set of retrieved data is obtained by the read operation which retrieved data is influenced by one or more distortion mechanisms as a result of the set of stored data having been stored in and read from the nonvolatile memory.

At 304, one or more quality metrics are generated responsive to the set of retrieved data which quality metric or metrics change in value responsive to differences between the user data and the associated retrieved data. Depending upon the particular embodiment of decoder 44 and QM generator 260 and by way of example, the quality metrics produced by QM generator 260 can include a branch metric of a Viterbi decoder or an LDPC decoder and, for a block correction code, the number of symbols corrected on a per codeword basis. These quality metrics are provided to quality monitor section 64. The latter also can receive mean values and variance values from mean value registers 110 and variance registers 210, respectively, to serve as quality metrics.

Still referring to FIG. 4, at 306, one or more of the quality metrics can be compared to a threshold value. For example, this comparison can establish a relationship between a current value of the quality metric and a threshold value. A baseline value of the quality metric may have been previously stored, for example, by quality monitor section 64, mean value registers 110 and/or variance registers 210. The baseline value can be established previously, for example, immediately after the write operation that stored the data in memory 20, as discussed above. In the context of this embodiment, the relationship can be established as a difference between the current value of a quality metric and the baseline value for comparison with the threshold value. When the difference does not exceed the threshold, operation moves to step 308, along a normal branch. Step 308 then determines if another set of data is available for entry into the process. If so, operation can return to step 302 for purposes of reading a subsequent set of data. When the difference, at 306, does exceed the threshold, however, operation proceeds along an error branch of the process to 310 for purposes of initiating a response to this condition which is indicative of having detected some level of degradation of the retrieved data in comparison with the original user data. Any suitable response may be invoked. In one embodiment, the user may be notified of the potential data degradation. In another embodiment, compensation procedures may be initiated. One suitable error response resides in adding a correction amount having a correction magnitude to each data value that makes up the associated set of retrieved data. Post-compensation offsets/values can be determined by post-compensation unit 70 and added to the retrieved data values by post-compensation adder 60. The magnitude of the correction can be based on the difference between the current value of the quality metric and the baseline value for the quality metric. That is, the correction magnitude can increase in proportion to an increase in the difference between the quality metric and the baseline value. Upon completion of step 310, operation returns to step 304 to regenerate the quality metric and, subsequently, retest its value in step 306. Upon satisfaction of the decision at 306, operation can return to step 308, which can lead to either reading a subsequent set of data at 302 or the end of the process at 312.

Figure 5:
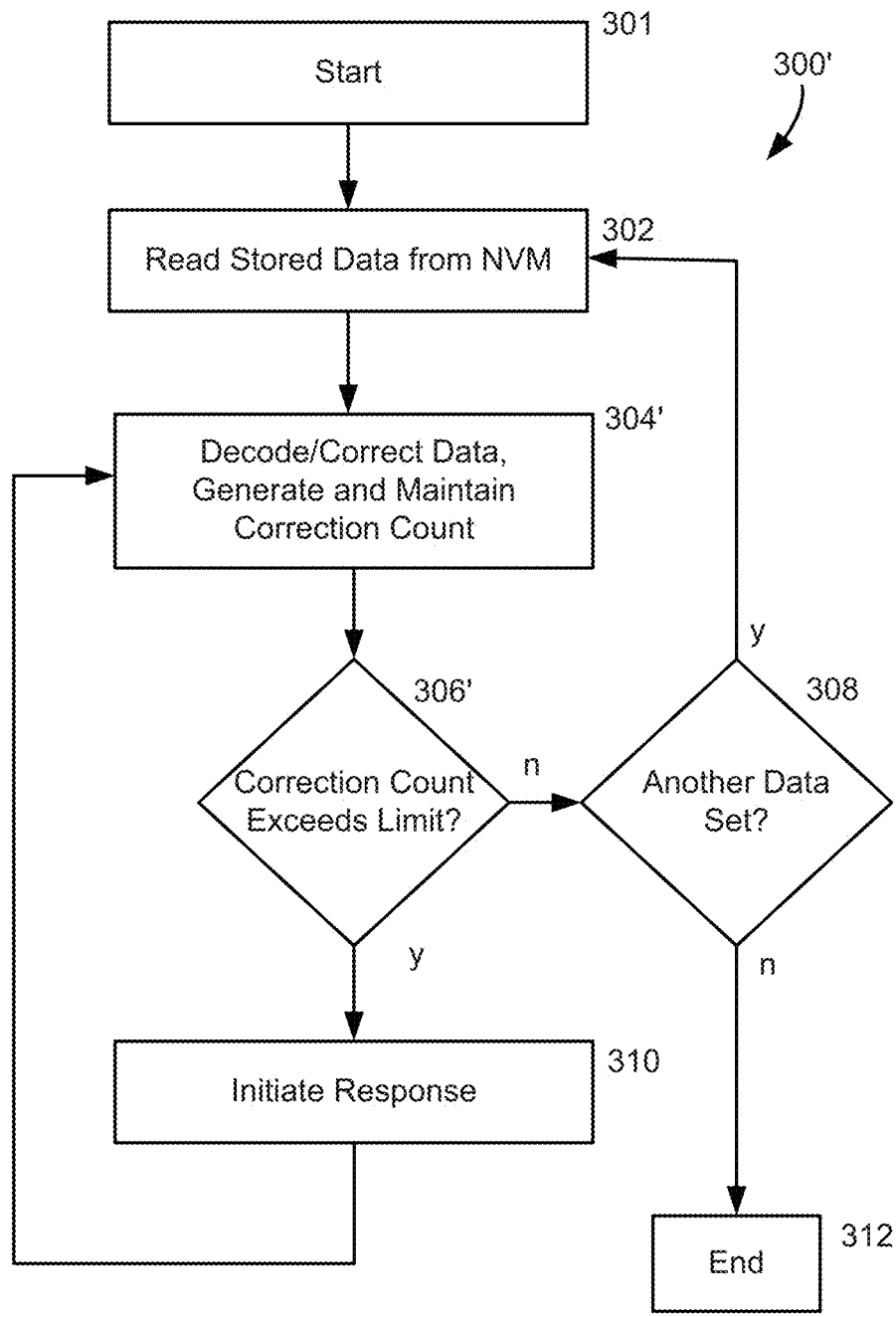
FIG. 5 is a flow diagram which illustrates another embodiment of a method for the operation of the controller of FIG. 1 relating to a quality metric in the form of a correction count of a block correction code.

Referring to FIG. 5, another embodiment of method 300 of FIG. 4 is illustrated, generally indicated by the reference number 300', for use with a block correction code that can be implemented in decoder 44 of FIG. 1. The process is entered at 301. At 302, a block or set of data is read from memory 20. At 304', the block is decoded and corrected according to any suitable block correction code that is in use such as, for example, Reed Solomon or BCH. QM generator 260 can maintain and save the number of corrections per block for reference purposes and the correction count can be provided to quality monitor section 64 of FIG. 1. At 306', the correction count is monitored. If the count does not exceed a specified correction count limit, which can be zero or a suitable larger value, operation moves to step 308. The latter then determines if another set of data is available for entry into the process. If so, operation returns to 302. If, on the other hand, the correction count limit is exceeded, operation proceeds to 310 which initiates a response to the potential degradation of data, as described above. Operation then can return to 304' which redetermines the correction count such that the method continues until the test at 306' is satisfied. If another set of data is not available at 308, the method ends at 312.

In view of the foregoing, additional details will now be provided with regard to the determination of quality metrics and related compensation in the context of charge trapping devices and their operation, although these details are not intended as limiting. That is, one of ordinary skill in the art may readily apply the present discussion to other forms of memory cell storage technologies. Using the example of a typical NAND device with N-Channel technology, one of ordinary skill in the art will appreciate that electrons injected into a floating gate or trapped charge region of each memory cell is the mechanism which provides for programmable data storage. Based on the amount of charge that is stored in a given memory cell, a well-known threshold voltage $V_T$ of the memory cell changes. Thus, read techniques establish the relative value of $V_T$. In a trapped charge device, such as NROM SONOS or a NAND SONO, or similar device in which a charge is trapped in what is typically a nitride layer in the gate region of a CMOS device, the addition of electrons or holes causes the well-known $V_T$ of the transistor that forms the memory cell to charge. Irrespective of the specific memory cell architecture, the value of the $V_T$ of a transistor of each memory cell represents the information being stored in that cell.

For a 1-bit/cell or single-level cell (SLC) device, the $V_T$ value can be a high or a low value (2 levels stored), for more complicated multi-level cell (MLC) devices, there may be 4 levels stored for a 2-bit/cell device, 8 levels stored for a 3-bit/cell device, 16 levels stored in a 4-bit/cell device, and so on. The expression $N=\log_2(L)$ describes the relationship between the number (L) of $V_T$ levels arranged in a cell and the number of bits (N) represented by the arrangement. Further, Applicants recognize that non-integer values of N are acceptable, for example, 3.585-bits/cell equates to 12-levels/cell.

Figure 6:
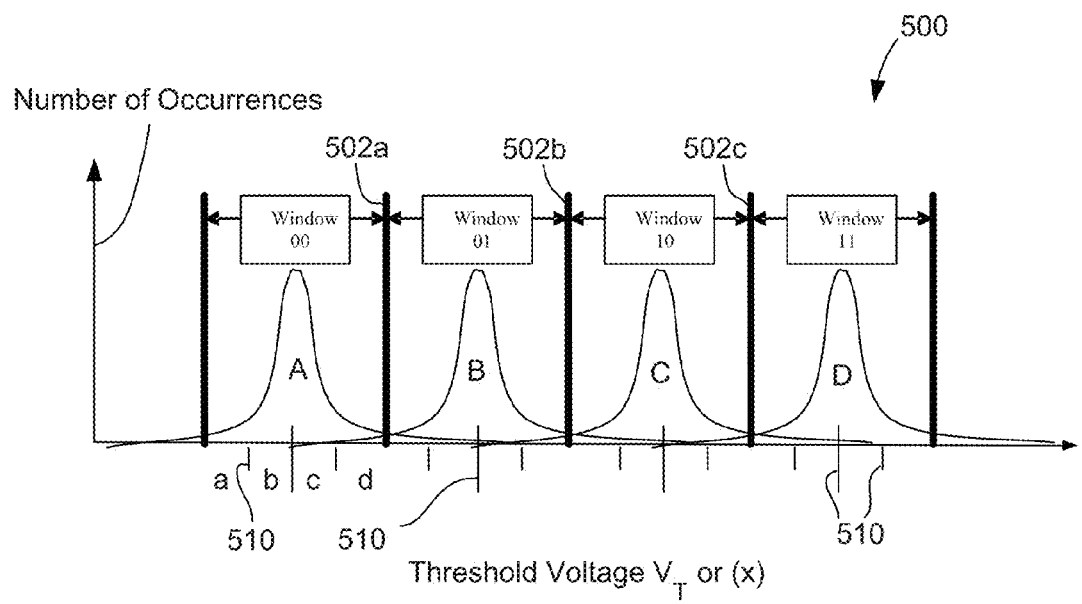
FIG. 6 is a plot which illustrates a set of idealized distributions of data values with respect to hard and soft windows.

Turning now to FIG. 6, an idealized distribution of data values for an example system is represented by a plot, generally indicated by the reference number 500. The example system stores two bits per cell such that four different distributions A-D of increasing $V_T$ are shown, with the vertical axis representing the number of occurrences of each value of $V_T$ and the horizontal axis representing $V_T$, which may be referred to interchangeably as the variable (x). Each idealized distribution is centered within an associated window designated as window 00 for distribution A, window 01 for distribution B, window 10 for distribution C and window 11 for distribution D. Since each idealized distribution is centered within a respective one of the windows, the average value and peak of each distribution is centered within its respective window. It should be appreciated that the idealized distribution of data values seen in FIG. 6 can result from reading a large number of data values stored in and read from a memory in the absence of any distortion mechanisms. Thus, a data distribution such as that of FIG. 6 can be constructed as a histogram by reading a suitably large number of memory cells. Such a histogram can be constructed based on normal user data that is obtained during read operations or based on calibration patterns. In this regard, Applicants have discovered that normal user data is sufficiently randomized so as to produce useful data distributions. For data obtained based on actual read operations, the resulting distributions can be affected in a number of ways, as will be described at one or more appropriate points below.

Still referring to FIG. 6, a 2-bit per cell device contains a total of 4 areas or windows of information A-D divided by three threshold levels which are designated as 502a, 502b and 502c. By way of example, a 4-bit per cell device has 16 windows for values to be written with 15 threshold levels separating these values. In the language of signal processing, the discrete thresholds separating the information values are referred to as hard thresholds. Data detection using hard thresholds can be referred to as slicer detection. Bits represented by hard thresholds may be referred to herein as hard bits. Higher resolution information, however, can indicate where a value lies between the hard thresholds and can be referred to as soft information or soft bits. Accordingly, the hard bits are of higher significance than the soft bits. Soft information relates to how close a particular sample is to a hard threshold and therefore to the probability that the sample was detected correctly. A detection sample accompanied by soft information that indicates the detected value is close to a hard threshold has a lower probability of being correct than a detected sample with soft information that indicates the detected value is centered between two hard thresholds. Signal processing algorithms such as Viterbi and Low Density Parity Codes, as well as others which can be present in decoder 44 (FIG. 1), use soft information in terms of error probabilities to aid in the correct decoding of a value or a sequence of values.

In the example of FIG. 6, each hard window 00-11 is over sampled with an additional 2 bits of soft information. Accordingly, the $V_T$ range of each hard window is divided into four sub-ranges which are designated as a-d for hard window 00. The sub-ranges are separated within each hard window by three soft thresholds 510, a number of which are specifically designated. A total of 16 soft window areas, or 4 bits, are therefore used to describe 2 bits of user data. It should be appreciated that the number of soft bits and information bits can be extended indefinitely in view of the present disclosure. For example, a system containing 4 bits of user information may be oversampled by 3 additional soft bits therefore requiring 7 bits of data to fully describe the 4 bits of user data. Each hard window corresponds to a range of the physical property of the memory cell that is used for purposes of storing information whereas each soft window corresponds to a sub-range of the physical property within one of the hard windows. The read operation establishes which soft window the physical property falls within.

Still referring to FIG. 6, it should be appreciated that the user data can be provided and written at a user data resolution including a specific number of user data bits to be stored per memory cell such as, for example, 2 bits per cell such that the physical property by which the memory cell stores information is divided at least into a specific number of regions that are separated by an arrangement of hard thresholds that correspond to the user data resolution. A set of stored data can subsequently be read in one or more read operations such that an associated set of retrieved data is obtained by the read operation from associated ones of the memory cells, which retrieved data is influenced by one or more distortion mechanisms as a result of the set of stored data having been stored in and read from the nonvolatile solid state memory. Such distortions can include a shift and spread of the distributions that are illustrated by FIG. 6, as will be illustrated by a subsequent figure. Other distortions, can include, for example, a peak that is introduced across the overall range of (x) or a valley which may be referred to as a droop. Further, more than one form of distortion can be present at the same time. Irrespective of the specific form of the distortion or distortions, a data value of the physical property can subsequently be read at a read resolution, for each associated memory cell, that is greater than the particular user data resolution to obtain a set of soft bits that are associated with each data value in the associated retrieved data such that the soft bits indicate where each data value resides between the hard thresholds thereby generating the soft information during the read operation. At least one correction or compensation value for the associated set of retrieved data can be determined based on the soft bits.

Figure 7:
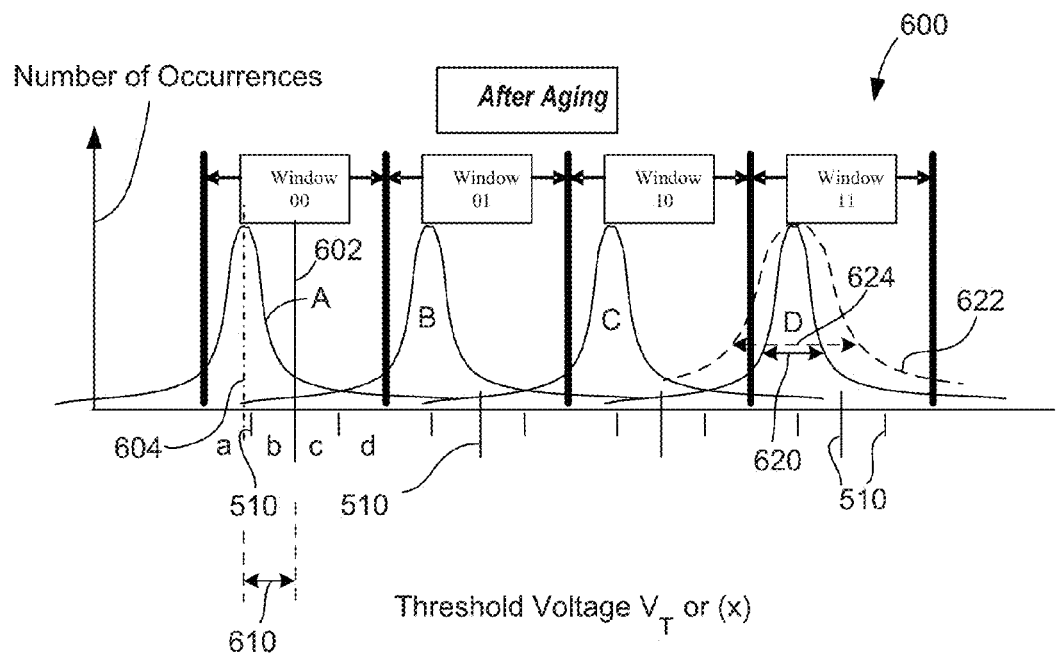
FIG. 7 is a plot of a distribution of possible data values, shown here to illustrate the effects of shifting due to aging as well as spreading in relation to hard and soft windows.

Referring to FIG. 7, an example distribution of data values that have been subject to the distortion of aging in memory 20 (FIG. 1) is represented by a plot that is generally indicated by the reference number 600. It is noted that the plot of FIG. 7 is based upon the plot of FIG. 6 using 2 bits of user information and 2 soft bits, by way of example, but is not intended as being limiting. In FIG. 7, it can be seen that distributions A-D are shifted downward in $V_T$ as compared to the corresponding distributions in FIG. 6. The soft bits or soft information can be provided for measurement and determination of standard statistical representations of the data such as, for example, the mean value within each hard window and the variance of all values within a hard window. The determined mean value, for example, can be used to indicate that data is not centered in a hard window. In FIG. 7 for hard window 00, a line 602 represents the centerline of the hard window. The mean value of distribution A is indicated by a line 604 such that the mean value of shifted distribution A is shifted in $V_T$ by an amount 610 which is shown as a double-headed arrow such that, in the present example, centerline 604 of distribution A falls within sub-range (a) of hard window 00. Thus, the illustrated shift indicates a significant probability of data error since sub-range (a) is immediately adjacent to the lower edge of hard window 00 and can trigger an appropriate error response. Difference 610 between the center of each window and the mean value can be used as a correction value to modify all data values within each window such that the mean value of the modified data is centered within the window. In this regard, it is noted that distributions B-D are also shown as being shifted by difference 610, however, the amount of shift for each distribution can be different such that a different amount of compensation can be applied for each distribution. Compensation can be performed in any suitable manner for purposes of correcting the stored data, for example, by rewriting the data once the amount of shift exceeds some threshold value. Correcting read data can be performed, for example, by adding an amount of data to each data value that is equivalent to shift 610. Pre-compensation can be accomplished by adding such an amount of data to each data value prior to writing the data values to memory.

Referring to FIGS. 6 and 7, the initial width of each of $V_T$ distributions A-D in FIG. 6 is typically due to variation of tolerances in the write operation. Accordingly, an initial variance or deviation can be determined in association with the initial width. An initial width 620 is indicated for the D distribution in FIG. 7 using a solid double-headed arrow. Subsequently, a spreading of the distributions can also accompany movement of the distributions following Program/Erase Cycling (known as endurance), and aging (also known as retention). Those having ordinary skill in the art will appreciate that a high temperature soak or bake for a known time can be considered as equivalent to the same programmed device aging for a much greater time at a more typical ambient temperature. It should be appreciated that each memory cell may program slightly differently and each memory cell may retain charge slightly differently. A subsequent distribution 622, representing changes in distribution D, is shown in phantom using a dashed line. The subject distribution is subject to spreading as well as shifting. A subsequent width 624 is indicated for the subsequent D distribution using a dashed double-headed arrow. Thus, the subsequent variance or width can be significantly larger than the initial variance or width of distribution D. It should be appreciated, however, that the mean value for shifted distribution D and the subsequent distribution 622 are identical, at least for purposes of the present example. The standard definition of Signal to Noise Ratio (SNR) for this class of transmission or storage channels is the width of the window divided by the standard deviation (sigma) of the signal distribution represented in either power or voltage decibels. A wide distribution with a large sigma has a low SNR. In one embodiment, quality monitoring section 64 (FIG. 1) can compare the subsequent variance with the initial variance, as determined by variance calculation 214, and determine an appropriate amount of compensation based on the comparison. In another embodiment, if a difference between the initial and subsequent variances exceeds a threshold, the memory cell can be rewritten so as to at least partially restore the initial variance. It should be appreciated that a histogram of data distributions can be developed for a retrieved set of data such as shown in FIG. 7 by filtering the retrieved data according to the sub-ranges of the physical properties that correspond to the soft bits, as will be further described. Stated in a slightly different way, histogram information can be developed by counting occurrences of each soft bit value between hard thresholds.

Referring to FIGS. 1, 6 and 7, a correction or compensation amount such as an amount corresponding to shift 610 can be added to each value of data by post-compensation adder 60 as each value is read from memory 20 to compensate for loss of charge that may occur due to extended storage time, temperature or voltage changes or degradation from multiple Erase/Program cycles. The correction amount added to each data value is often less than a full hard bit, however, compensation is not restricted to soft bits. The latter are of benefit in allowing for relatively small amounts of correction to be added to data, often without changing the hard bit value. As discussed above, the mean value can shift by a different amount for each of distributions A-D corresponding to each of the hard windows. In one embodiment, the average mean error can be determined for each of distributions A-D, resulting in four mean values in the present example. An average of these four values can then be applied as an overall correction value for all retrieved data values. It should be appreciated that any available number of distributions can contribute to the overall average and that the use of four distributions is by way of example and not intended as limiting. In another embodiment, the mean error for each window is determined and used as a correction value applied only to those values that fall within that particular window such that each window can be subject to a different correction value.

In yet another embodiment, the determined mean position of the data for each window can be used to establish a curve fit equation extending across the entire range of $V_T$ values in FIG. 7. The curve fit equation can take on any desirable form of any order or form that is necessary for representing the data. By way of example, suitable curve fitting procedures will be familiar to those of ordinary skill in the art and include, but are not limited to Polynomial fit, Exponential Fit, Spline Fit, Least Squares Fit and so on. In general, the best type of fit depends on the data that is being fitted. In one embodiment, a processor implementation of the curve fitting procedure can allow for the flexibility to change not only the parameters of the curve fit but also the type of curve fitting operation. Once a curve fit equation is established, the equation can be used to determine the correction amount for each data value based on the difference between the curve fit and the desired location of that data.

This correction/compensation process can be characterized by the equation:

$$\text{Correction amount} = f(x) - g(x) \quad (1)$$

where $f(x)$ is a function that represents the curve fit of the data and $g(x)$ is a function that represents the desired location of the data. The variable (x), as noted above, can represent $V_T$. Function $g(x)$ gives a desired value of $V_T$ for a given input value of $V_T$ while $g(x)$ represents the actual input value of $V_T$. The correction amount, as reflected by Equation 1, for each input data value (x) is then added to the input data value to produce a compensated value as an output. The correction amount may be positive or negative.

Figure 8:
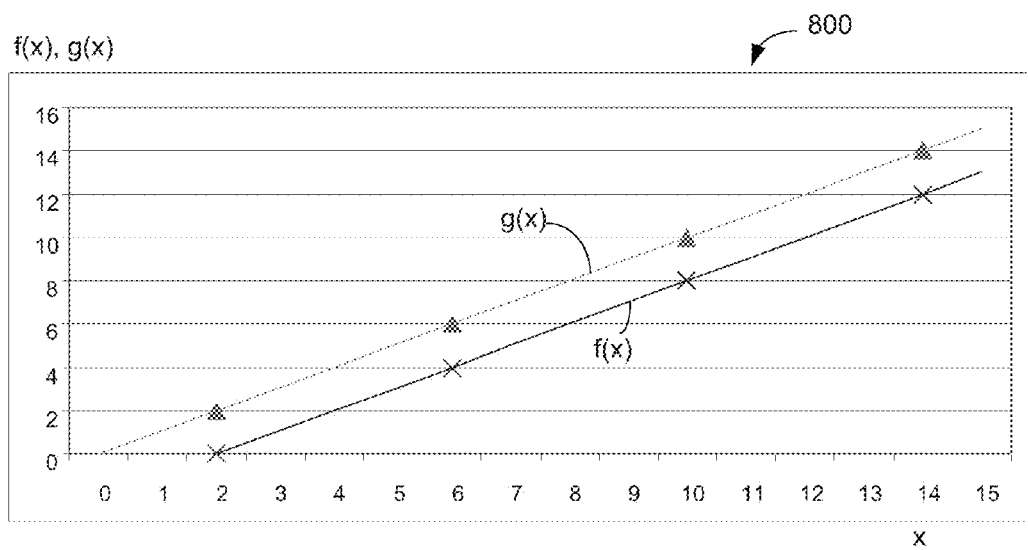
FIG. 8 is a plot of desired data values of a distribution as well as a curve fit plot that conforms to a set of measured values, shown here to illustrate the development of compensation based on the plots wherein a linear fit is applied.

Turning to FIG. 8, a plot of f(x) and g(x) versus input values (x) is generally indicated by measured mean locations or measured data values in f(x) are each designated by an X. Data, in terms of both equations is described as a first order equation of the type y=mx+b where an output representation of the data, y, is calculated by multiplying the actual data value x, by a gain factor m, and adding a constant value b where b can be positive or negative. In the example of FIG. 8, $$g(x) = x \quad (2)$$

$$f(x) = x - 2 \quad (3)$$

The difference between the curve fit representation of the data given by f(x) and the desired location of the data given by g(x) for a given value of (x) becomes the correction amount that needs to be added to the given value of (x) which would be needed to center the data within a window. In the present example, with both f(x) and g(x) being linear expressions:

$$\text{Correction amount} = f(x) - g(x) = x - (x-2) = +2 \quad (4)$$

Accordingly, for any given input value of (x), the correction value is x+2.

Figure 9:
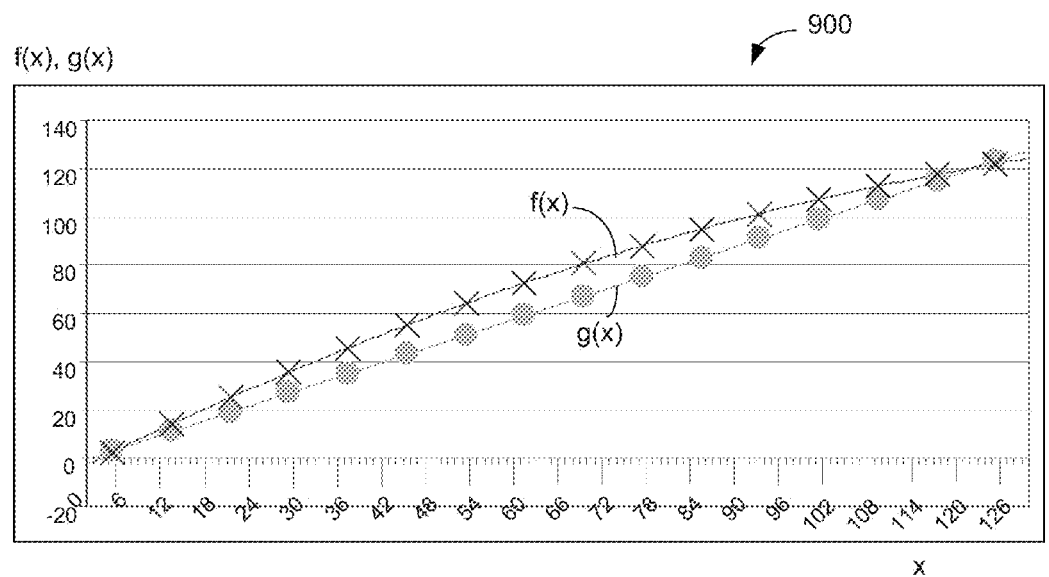
FIG. 9 is another plot of desired data values of a distribution as well as a curve fit plot that conforms to a set of measured values, shown here to illustrate the development of compensation based on the plots wherein a nonlinear curve fit is applied.

Referring to FIG. 9, another plot of f(x) and g(x) versus input values (x) is generally indicated by the reference number 900. Again, f(x) is a function that represents the curve fit of the data and g(x) is a function that represents the desired location of the data. Desired mean locations are designated in f(x) by circles, while measured locations or measured data values are each designated by an X. It is noted that the shape of f(x) may be considered as peak whereas a droop would appear oppositely along the vertical axis so as to extend below g(x). In this figure, 4-bit data is represented with 16 possible data values separated by 15 hard thresholds, however, each hard threshold is further divided by 7 additional soft thresholds resulting in a total of 128 possible values. Accordingly, the 4 bit data in this example is subject to 16 distributions, similar to the previous 2 bit data example of FIG. 8, except that for this example the mean locations of the data can be represented as a second order equation of type:

$$y = ax^2 + bx + c \quad (5)$$

Thus, g(x) remains in the form of Equation (2) above while f(x) can be in the quadratic form of Equation (5), although this not a required form since any suitable form can be used which provides a desired level of curve fit. The implementation of this correction can be performed in many different ways, as will be described immediately hereinafter.

Figure 10:
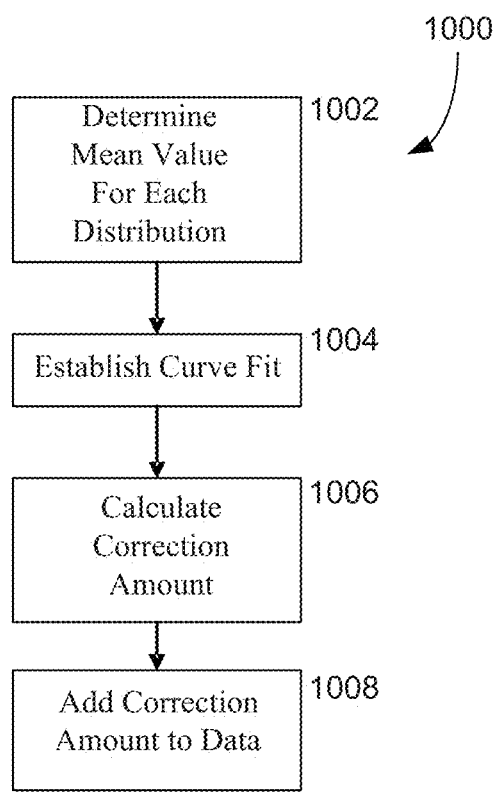
FIG. 10 is a flow diagram which illustrates one embodiment of a method for determining the statistical mean value and curve fit of a data distribution for establishing a correction or compensation amount.

Referring to FIG. 10, a method for curve fitting a set of data and applying correction is generally indicated by the reference number 1000. The method begins at 1002 by determining a mean value for each distribution that enters the method in accordance with the techniques that have been described above. It should be appreciated that a variance or any other suitable statistic of interest may also be determined. At 1004, a curve fitting procedure can be used to formulate a curve fit equation which conforms to the mean values of each distribution. At 1006, a correction amount is determined for each data value of each distribution based on the curve fit representation of the data and the desired location of the data, for example, as described above with regard to FIGS. 8 and 9. At 1008, the method ends with adding the correction amount to the data of the distribution by post-compensation adder 60 (FIG. 1) or pre-compensation adder 62 via post-compensation unit 70 and pre-compensation unit 72, respectively. It should be appreciated that any or all of these steps can be performed by microcontroller 50 or by application specific hardware designed specifically for the function to be performed and that either is readily configurable by one having ordinary skill in the art in view of the teachings that have been brought to light herein.

Still referring to FIG. 10 in conjunction with FIG. 1, in one embodiment, microcontroller 50 determines the statistical mean values and curve fit equations from the data distribution after the data has been transferred from memory 20 to temporary memory 103. This embodiment can allow for additional flexibility involving unusual cases of curve fitting and can allow for the statistical calculation of mean values to be adjusted based on program variables. The correction amount that is determined can be added to the data while the data resides in temporary memory 203 or the correction amount can be added in an application specific hardware function to reduce the burden on the processor and improve overall system performance.

In one embodiment, the mean value determination can be performed by filtering the data of a distribution or collection of values within a number of sub-ranges of values, each of which can represent one of the soft windows. The mean value of all data within each sub-range is calculated by summing the data and dividing by the number of samples. Any suitable technique may be employed, however, for purposes of determining mean values of a given distribution including, for example, the use of variable ranges or ranges and offsets, moving averages, exponential moving averages, and low pass filtering as well as other well known mean or average value calculations. It should also be appreciated that a given averaging technique can generally readily be implemented in hardware and, therefore, this function can be removed from the burden on a processor by being implemented as a hardware function. In one hardware embodiment, an averaging unit can be included in the data stream between post-compensation adder 60 and memory interface 34 such that, as data is read from memory 20, the averaging result is ready for processing as soon as the data distribution is completely available to adder 60 or filled into temporary memory 103. In such a hardware implementation, the mean calculating circuitry can be duplicated based on the number of distributions that are expected to be available for calculation, as will be further described immediately hereinafter.

Figure 11:
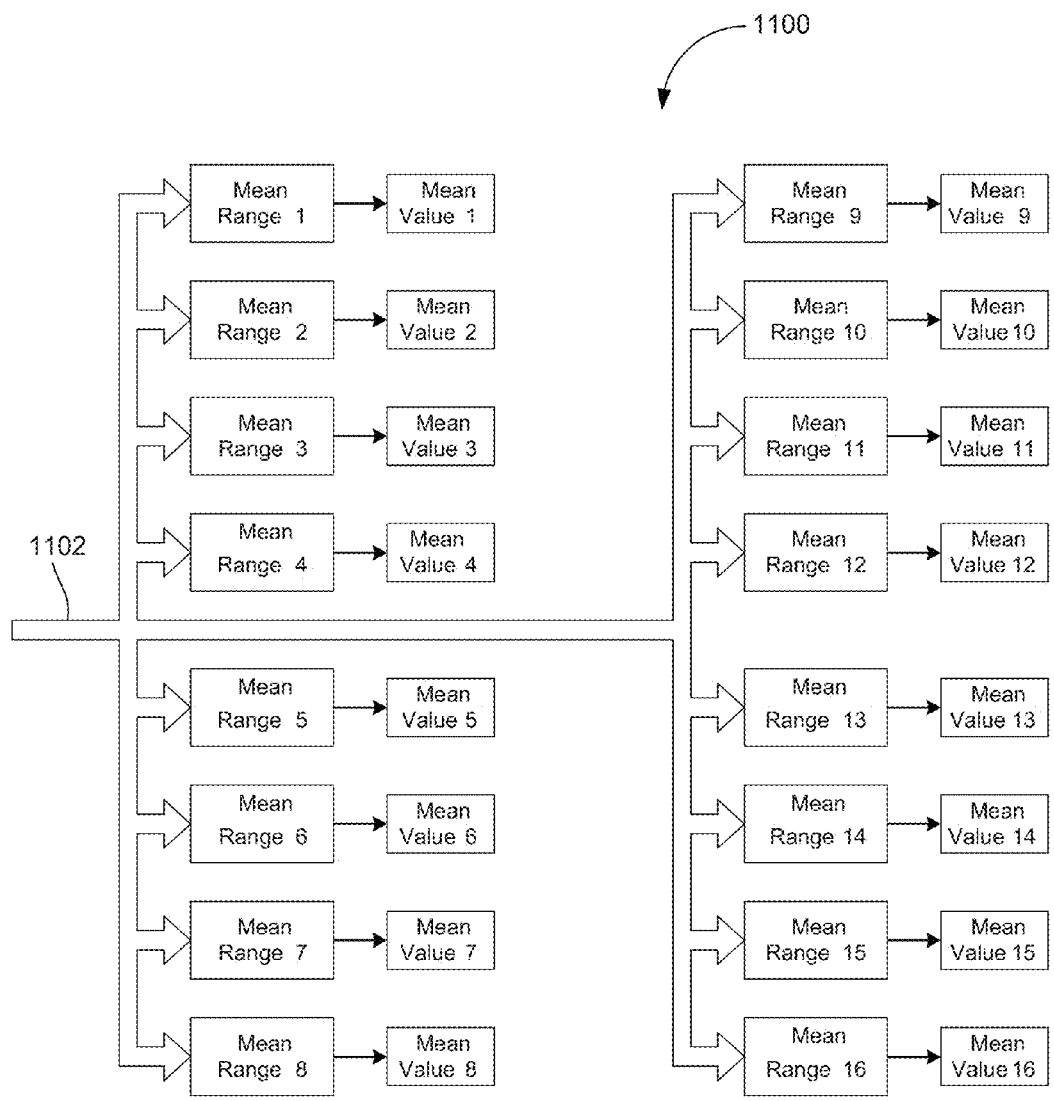
FIG. 11 is a block diagram which illustrates one embodiment of a hardware mean value determination unit for determining a mean value for each one of a plurality of sub-ranges which can make up an overall range of a data distribution.

Attention is now directed to FIG. 11, which is a block diagram illustrating one embodiment of a hardware mean determination unit that is generally indicated by the reference number 1100. The latter, by way of example, is configured for use in a 4-bit system, however, one of ordinary skill in the art can readily adapt such a unit to any desired number of bits based on the teachings herein. For the 4-bit mean determination unit, there are 16 possible distributions that are expected, corresponding to 16 possible values. Therefore, the hardware system includes 16 separate mean range units, as shown in FIG. 11 and appropriately numerically designated. Each mean range unit 1-16 receives input data distributions on an input data path 1102 and provides a mean value to an associated mean value register 1-16, each of which is appropriately numerically designated. In one embodiment, the ranges of mean range detectors 1-16 can be consecutive and non-overlapping, for example, corresponding to each soft window such as those seen in FIG. 7. In another embodiment, the ranges can at least partially overlap one another. As seen, for example, in FIG. 7, this overlap can reflect the overlap of distributions A-D. In still another embodiment, the ranges can be spaced apart such that some values of $V_T$ or (x) are excluded from averaging as part of any distribution. The latter can be used, for example, when higher relative accuracy in the determined mean value is desired.

Figure 12:
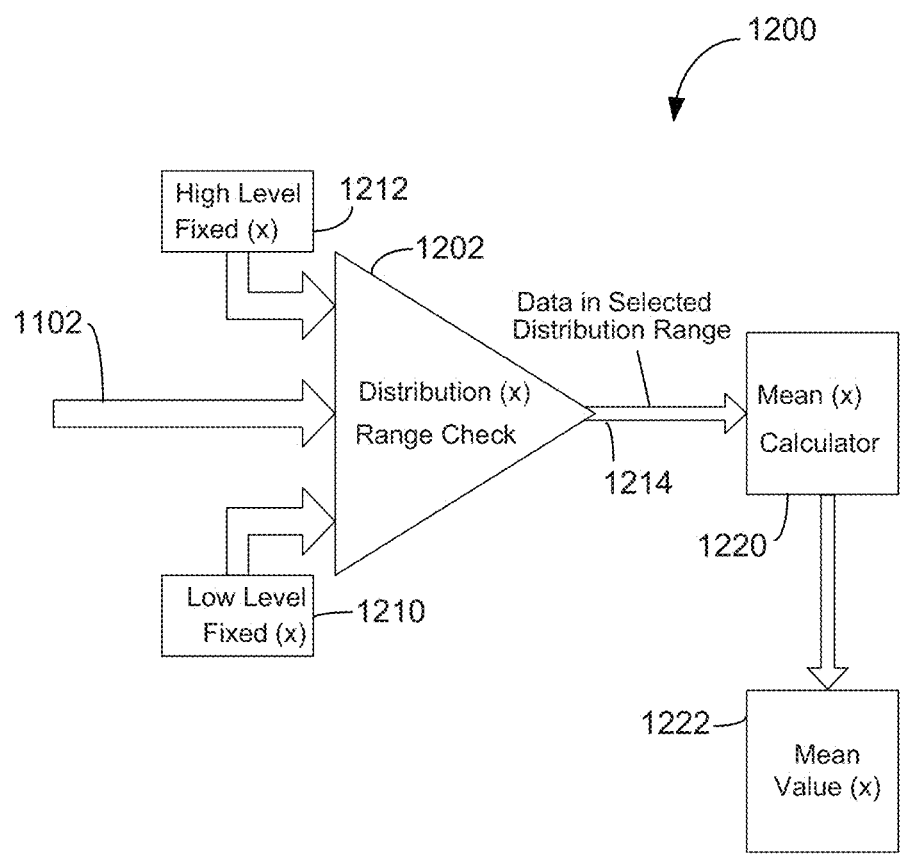
FIG. 12 is a block diagram of one embodiment of a mean range unit that is used in the hardware mean value determination unit of FIG. 11.

Referring to FIG. 12 in conjunction with FIG. 11, the former is a block diagram which illustrates one embodiment of mean range units 1-16 seen in FIG. 11, generally indicated by the reference number 1200. All input distribution values are received from distribution input 1102 by a distribution range checker 1202. The distribution range checker is effectively a band pass filter for the input distribution values and passes through only those values within a range that is specified from a low level fixed (x) value 1210 to a high level fixed value 1212. Thus, output 1214 of each distribution range checker can include only data values that fall within the specified range between and including the specified low level 1210 of (x) and the specified high level 1212 of (x). Mean calculator 1220 receives the in-range data values and determines the mean value of the received values. The mean value is stored by a mean value register 1222. Thus, mean determination unit 1100 of FIG. 11 generates the mean value for each sub-range of interest based on the manner in which the High/Low level limits of the respective mean range units 1-16 are set.

Referring again to Equation (1) above, the correction amount can be a difference between two equations performed between the desired data and the curve fit data. This can be implemented in one embodiment as a difference of equations and therefore carried out by a processor. In another embodiment, a difference of tables approach can be taken with a data table representing an incoming distribution of data and a desired data location table representing targeted values. Either one or both of these tables can be filled-in from an associated equation. For purposes of the table that is generated from the output of the curve fit equation, the data table can be generated, at least in part, using directly measured values obtained from a data distribution. Differencing of table operations can readily be performed by a processor or implemented as an application specific piece of hardware. It is considered that one of ordinary skill in the art can readily configure either approach with this overall disclosure in hand. It should be appreciated, as will be seen immediately below, that a table based approach readily accommodates nonlinear or piecewise linear functions or any desired combination thereof.

Figure 13:
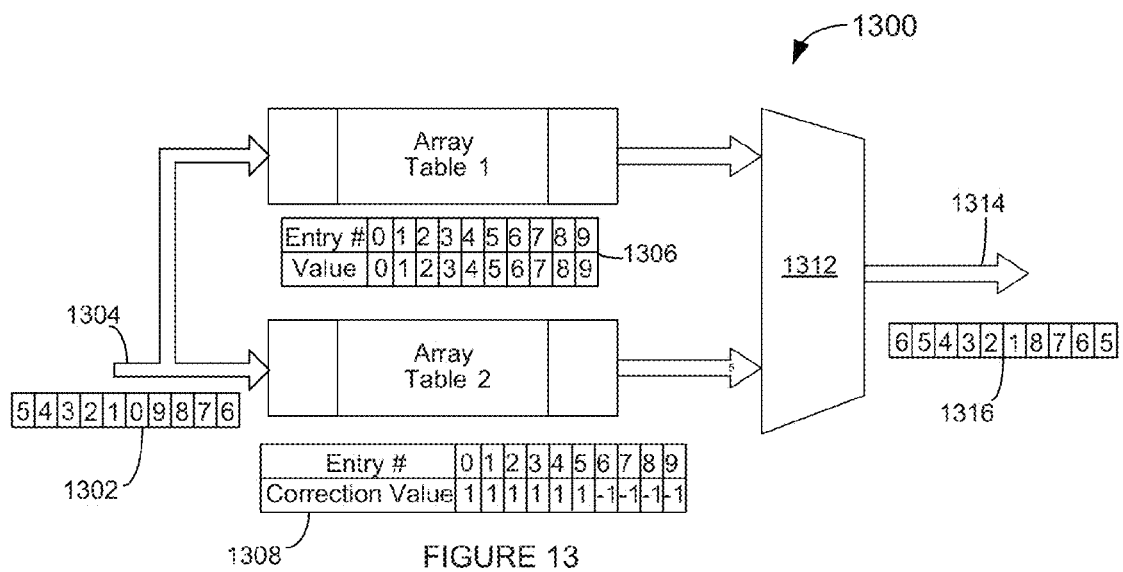
FIG. 13 is a block diagram of one embodiment of a difference-of-tables based circuit that applies correction amounts to an incoming distribution stream to produce an output stream.

FIG. 13 is a block diagram of one embodiment of a difference-of-tables based circuit, generally indicated by the reference number 1300. In this embodiment, circuit 1300 is configured for applying correction amounts to an example incoming distribution stream 1302 that is available on an input line 1304. Input stream 1302, by way of nonlimiting example, includes the sequence of values 5, 4, 3, 2, 1, 0, 9, 8, 7, 6. Table 1 entries and values are indicated by the reference number 1306 wherein each entry is indexed by its data value. That is, the data value for a given entry number value is equal to the given entry number. For example, the data value for table entry 1 is equal to 1; the data value for table entry 2 is equal to 2; the data value for table entry 3 is equal to 3; and so on. Table 2 sets forth the correction value according to the same set of entry numbers as Table 1. By way of non-limiting example, a set of correction values is indicated by the reference number 1308. For Table 2, example entries 0-5 are each set to 1 while entries 6-9 are each set to −1. It should be appreciated that the set of correction values, in this example, represents a piecewise linear function and that segments of the table can represent many forms of functions including nonlinear functions in a flexible manner to make up a piecewise array of function segments. Further, the correction values can be positive or negative. Input stream 1302 passes through Table 1 and Table 2 synchronously such that corresponding table entries are added by an adder 1312 resulting in an output stream 1314 based on the input stream, Table 1 and Table 2. In the present example, the output stream values are 6, 5, 4, 3, 2, 1, 8, 7, 6, 5. The data values in FIG. 13 have been given as whole numbers for descriptive purposes and to facilitate the reader's understanding, however, it should be appreciated that such values can represent data values of any length including soft information appended to hard or data bits. In another embodiment, circuit 1300 can be implemented in software with associated functions executed by a processor such as, for example, microcontroller 50 of FIG. 1.

Figure 14:
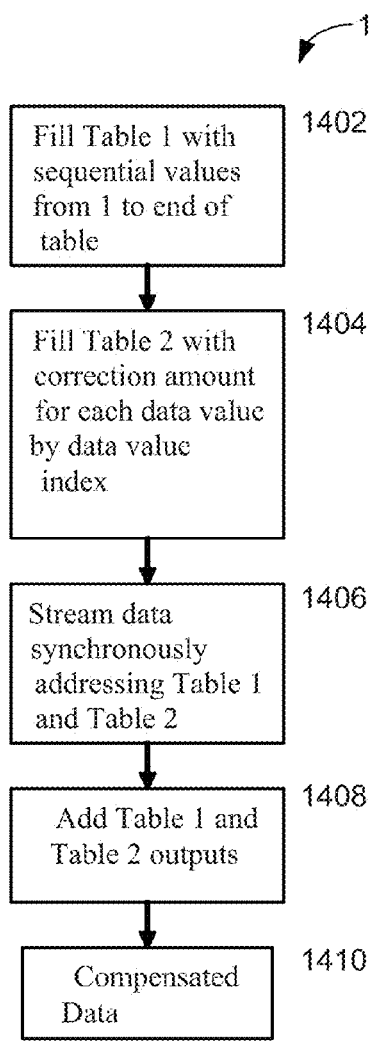
FIG. 14 is a flow diagram which illustrates one embodiment of a method for initializing and operating the difference-of-tables circuit of FIG. 13.

Referring to FIG. 14 in conjunction with FIG. 13, one embodiment of a method for initializing and operation of the difference-of-tables circuit of FIG. 13 is generally indicated by the reference number 1400. At 1402, the method begins by filling Table 1 with any desired values such as, for example, sequential values from 1 to the end of the table. At 1404, Table 2 is loaded with correction amounts corresponding to each entry from entry 1 to the end of the table. At 1406, incoming data 1302 is streamed to Tables 1 and 2 such that the tables are addressed synchronously. At 1408, adder 1312 adds the presented values. At 1410, the method ends with adder 1312 producing compensated output 1314. It should be appreciated that the present approach is very versatile such that the values in either table can be reloaded as desired. For example, Table 2 can be reloaded with different correction amounts that can pertain to other types of compensation or for retry attempts on the original data if unsatisfactory results were obtained with the first pass of compensation. In another embodiment, Table 1 can be loaded with corrected output values such that Table 2 as well as adder 1312 are not needed. That is, Table 1 can be loaded with the values:

TABLE 1

| | Entry # | | | | | | | | | |
|---|---|---|---|---|---|---|---|---|---|---|
| | 0 | 1 | 2 | 3 | 4 | 5 | 6 | 7 | 8 | 9 |
| Compensated Output | 6 | 5 | 4 | 3 | 2 | 1 | 8 | 7 | 6 | 5 |

Figure 15:
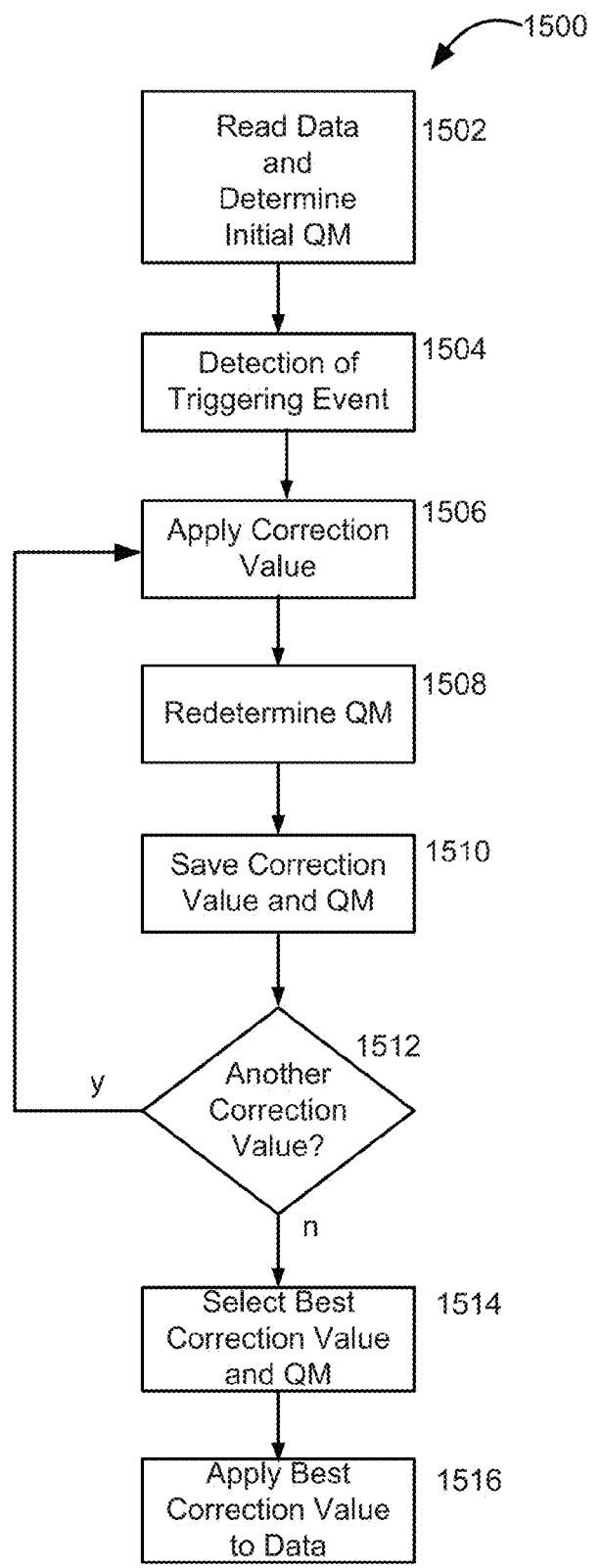
FIG. 15 is a flow diagram which illustrates one embodiment of a method for determining a compensation value, based on iterative determinations of at least one quality metric.

Turning to FIGS. 1 and 15, the latter is a flow diagram which illustrates one embodiment of a method for determining a correction or compensation value generally indicated by the reference number 1500. It should be appreciated that this method can be employed, for example, by quality monitoring section 64 of FIG. 1 for purposes of determining correction values to be provided to post-compensation unit 70 and pre-compensation unit 72, for example, based on quality metrics received from quality metric unit 260 of decoder 44 such as, for example, a bit error rate (BER), the mean squared error (MSE) or of a trellis decoder, a Correction Count (CC) based on a block error correction code, the mean value of the distribution from mean calculator 114 or the variance from variance calculator 214. At 1502, a data set or distribution of interest is read and an initial baseline value of at least one quality metric is determined. At 1504, a triggering event is detected which can include the passage of time, the degradation of the data set in a read back operation accompanied by a comparison of a current value of the quality metric to the baseline value, the number of errors corrected per block in a block error correction code and any other suitable event that is an indicator of at least a potential degradation of the data set. It should be appreciated that the quality metric can be monitored on a regular basis in comparison to some threshold value. Detection can take place when the threshold is exceeded. At 1506, a correction value is applied to the data set. The correction value can be selected, for example, based on a determined mean value. In one embodiment, the method incrementally steps through a range of potential values for the correction values. At 1508, the quality metric is re-determined with the correction value in place. At 1510, the correction value and associated value of the quality metric are saved for reference purposes. At 1512, a determination is made as to whether another correction value is to be applied to the data set. If so, operation returns to step 1506. Otherwise, operation proceeds to 1514 wherein the best correction value producing a value of the quality metric that most nearly approaches the baseline value is selected for application in correcting the data. That is, the selected value represents the highest quality of the data or the greatest improvement in quality among all of the correction values that are applied. At 1516, the selected correction value is applied to the data for correction purposes. Accordingly, the correction value can be optimized based on iterative determinations of a quality metric.

Figure 16:
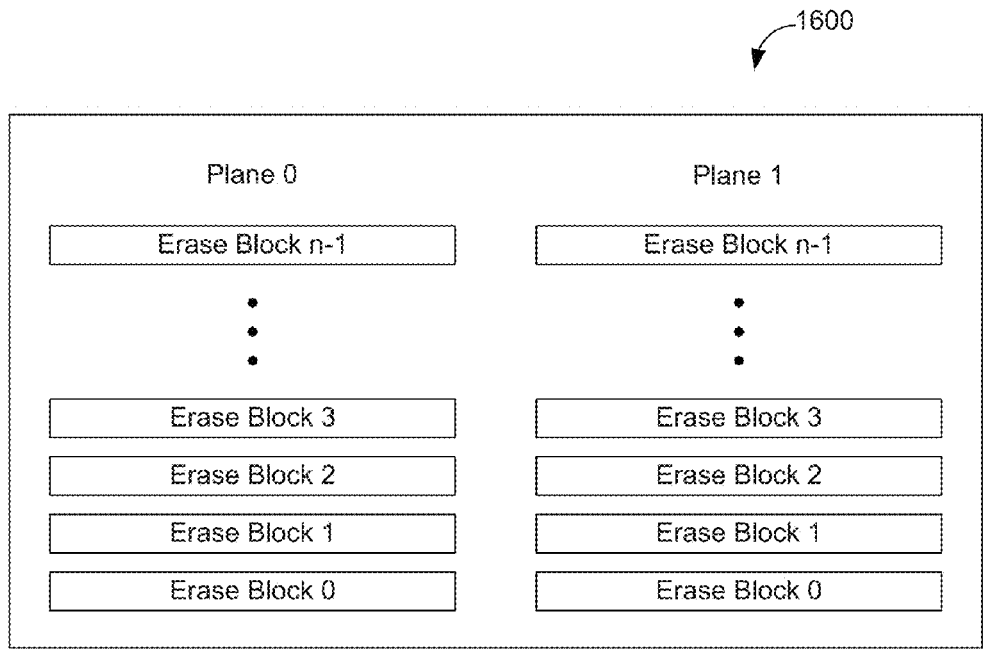
FIG. 16 is a diagrammatic plan view of one embodiment of a memory die that is suitable

Referring again to FIG. 1 and by way of example, memory 20 is shown as including a plurality of semiconductor memory die 1600 (two of which are shown) as the nonvolatile memory devices described above. FIG. 16 diagrammatically illustrates details of one embodiment of the physical layout of each memory die 1600. In particular, each memory die 1600 can be made up of a pair of regions that are designated as Plane 0 and Plane 1. Each of these planes is made up of a plurality of n erase blocks that are designated as erase blocks 0 to n-1.

Figure 17:
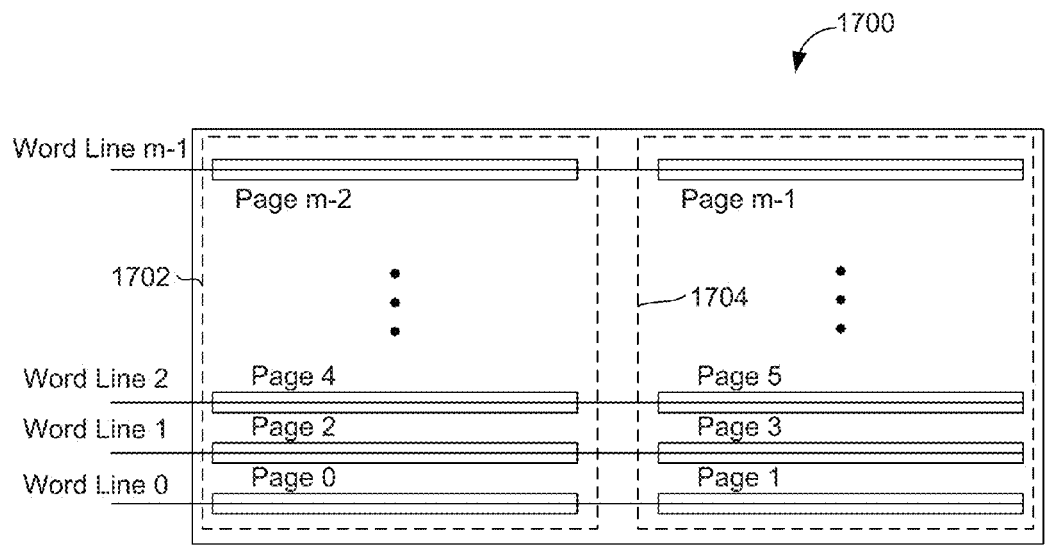
FIG. 17 is a diagrammatic plan view illustrating one embodiment of an erase block that forms part of the memory die of FIG. 16.

Referring to FIG. 17, in conjunction with FIG. 16, the former diagrammatically illustrates one embodiment of an erase block, that is suitable for use in forming the erase blocks of each die 1600, generally indicated by the reference number 1700. Erase block 1700 includes a plurality of pages that are arranged along word lines that are designated as word line 0 through word line m-1. Each word line is made up of a plurality of pages. In the present example, each word line includes two pages. The pages are designated as page 0 through page m-1 such that there are a total of m pages making up each erase block. The pages, in the present example, are arranged as a first group 1702 of even numbered pages, shown within a dashed rectangle, and a second group 1704 of odd numbered pages, also shown within a dashed rectangle. As discussed above, compensation can be applied based on the physical layout of a memory die such as various sub-regions of the memory die. The sub-regions can be selected, in suitable embodiments, based on the on planes, erase blocks, word lines or pages such as these features as diagrammatically illustrated by FIGS. 16 and 17.

The foregoing description of the invention has been presented for purposes of illustration and description. It is not intended to be exhaustive or to limit the invention to the precise form or forms disclosed, and other modifications and variations may be possible in light of the above teachings wherein those of skill in the art will recognize certain modifications, permutations, additions and sub-combinations thereof.

CONCLUSION

The present disclosure brings to light an apparatus and associated method for use with a nonvolatile memory that is made up of a plurality of memory cells for storing user data where the memory cells are configured for storing the user data based on a physical property that can be set responsive to a programming operation and for reading the stored data, that is representative of the user data, in a read operation.

In one embodiment, an encoder reads a set of the stored data in the read operation such that an associated set of retrieved data is obtained by the read operation which retrieved data is influenced by one or more distortion mechanisms as a result of the set of stored data having been stored in and read from the nonvolatile solid state memory. A quality metric generator generates a quality metric responsive to the retrieved data which quality metric changes in value responsive to differences between the user data and the associated retrieved data. A quality monitor section establishes a relationship between a current value of the quality metric and a threshold value and monitors the relationship as being indicative of a degradation of the quality of the retrieved data, and selectively initiates an error response event responsive to the monitoring.

In another embodiment, a decoder reads a set of the stored data in the read operation such that an associated set of retrieved data is obtained by the read operation which retrieved data is influenced by one or more distortion mechanisms as a result of the set of stored data having been stored in and read from the nonvolatile solid state memory. A quality metric generator generates an initial quality metric responsive to the retrieved data which initial quality metric changes in value responsive to differences between the user data and the associated retrieved data. A quality monitoring section iteratively adds a series of correction values to the set of retrieved data to form a series of corrected sets of retrieved data such that a modified quality metric is associated with each one of the series of corrected sets of retrieved data and selects a particular one of the series of correction values which yields the greatest improvement in the quality metric for subsequently correcting at least a subsequent set of retrieved data from the memory. In one feature, the selected correction value can be identified in view of a baseline value of the quality metric that is associated with initially storing the data.

The foregoing description of the invention has been presented for purposes of illustration and description. It is not intended to be exhaustive or to limit the invention to the precise form or forms disclosed, and other modifications and variations may be possible in light of the above teachings wherein those of skill in the art will recognize certain modifications, permutations, additions and sub-combinations thereof.

What is claimed is:

1. A method for use with a nonvolatile memory that is made up of a plurality of memory cells for storing user data where the memory cells are configured for storing the user data based on a physical property that can be set responsive to a programming operation and for reading the stored data, that is representative of the user data, in a read operation, said method comprising:
    reading a set of the stored data in the read operation such that an associated set of retrieved data is obtained by the read operation which retrieved data is influenced by one or more distortion mechanisms as a result of the set of stored data having been stored in and read from the nonvolatile memory;
    decoding and correcting the set of retrieved data based on a block correction code to generate a correction count responsive to differences between the user data and the retrieved data; and
    based on the correction count, selectively initiating an error response event for changing the retrieved data.

2. The method of claim 1, further comprising:
    re-determining the correction count after the error response event for comparison to a correction count limit.

3. The method of claim 1 wherein the error response event is selectively initiated based on the correction count exceeding a correction count limit.

4. The method of claim 1 wherein reading retrieves a block of data having block correction code data associated therewith and decoding generates the correction count as a number of corrections per block of the retrieved data.

5. The method of claim 4 further comprising:
    re-determining the correction count for the block of data subsequent to the error response event and initiating another error response event if the correction count continues to exceed a correction count limit.

6. The method of claim 5, further comprising:
    reading an additional set of stored data as part of the read operation such that an additional associated set of retrieved data is obtained as influenced by the one or more distortion mechanisms as a result of having been stored in and read from the nonvolatile solid state memory;
    decoding the additional set of retrieved data to generate an additional correction count responsive to differences between the user data and the additional retrieved data; and
    based on the additional correction count, selectively initiating an additional error response event for changing the additional retrieved data.

7. The method of claim 6, further comprising:
    repeating the method of claim 5 for further additional sets of stored data.

8. The method of claim 1 wherein the block correction code is one of a Reed Solomon code and a BCH code.

9. The method of claim 1 wherein initiating the error response event includes generating a warning and directing the warning to a user of the memory to indicate at least a potential loss of the user data.

10. The method of claim 1 wherein the error response event includes adding a correction amount having a correction magnitude to each data value that makes up the associated set of retrieved data.

11. An apparatus for use with a nonvolatile memory that is made up of a plurality of memory cells for storing user data where the memory cells are configured for storing the user data based on a physical property that can be set responsive to a programming operation and for reading the stored data, that is representative of the user data, in a read operation, said apparatus comprising:
    a decoder for reading a set of the stored data in the read operation such that an associated set of retrieved data is obtained by the read operation which retrieved data is influenced by one or more distortion mechanisms as a result of the set of stored data having been stored in and read from the nonvolatile memory and for decoding and correcting the set of retrieved data based on a block correction code to generate a correction count responsive to differences between the user data and the retrieved data; and
    a quality monitoring section for selectively initiating an error response event for changing the retrieved data based on the correction count.

12. The apparatus of claim 11 wherein the quality monitoring section is configured to re-determine the correction count after the error response event for comparison to a connection count limit.

13. The apparatus of claim 10 wherein the quality monitoring section is configured to selectively initiate the error response event based on the correction count exceeding a correction count limit.

14. The apparatus of claim 11 wherein the decoder is configured to read the set of stored data by retrieving a block of data having block correction code data associated therewith and, thereafter, decode the block of data by generating the correction count as a number of corrections per block of the retrieved data.

15. The apparatus of claim 14 wherein the decoder is configured to re-determine the correction count for the block of data subsequent to the error response event and initiate another error response event if the correction count continues to exceed a correction count limit.

16. The apparatus of claim 15, wherein the decoder is configured to read an additional set of stored data as part of the read operation such that an additional associated set of retrieved data is obtained as influenced by the one or more distortion mechanisms as a result of having been stored in and read from the nonvolatile solid state memory and decode the additional set of retrieved data to generate an additional correction count responsive to differences between the user data and the additional retrieved data and the quality monitoring section is configured to selectively initiate an additional error response event for changing the additional retrieved data based on the additional correction count.

17. The apparatus of claim 16 configured to read further additional sets of stored data, generate a further additional correction count responsive to each additional set of data and initiate further additional error response events based on each further additional correction count.

18. The apparatus of claim 11 wherein the block correction code is one of a Reed Solomon code and a BCH code.

19. The apparatus of claim 11 wherein the quality monitoring section initiates the error response event including generating a warning and directing the warning to a user of the memory to indicate at least a potential loss of the user data.

20. The apparatus of claim 11 wherein the quality monitoring section executes the error response event by adding a correction amount having a correction magnitude to each data value that makes up the associated set of retrieved data.

* * * * *